United States Patent
Kawakami

(10) Patent No.: US 7,829,246 B2
(45) Date of Patent: Nov. 9, 2010

(54) METHOD OF FORMING PATTERN

(75) Inventor: Yukiya Kawakami, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 930 days.

(21) Appl. No.: 11/593,543

(22) Filed: Nov. 7, 2006

(65) Prior Publication Data
US 2007/0105051 A1 May 10, 2007

(30) Foreign Application Priority Data
Nov. 8, 2005 (JP) .............................. 2005-323604

(51) Int. Cl.
G03F 1/00 (2006.01)
(52) U.S. Cl. ............................ 430/5; 430/311; 430/394
(58) Field of Classification Search .................... 430/5, 430/311; 716/19, 21
See application file for complete search history.

(56) References Cited

U.S. PATENT DOCUMENTS

| | | | |
|---|---|---|---|
| 6,518,180 B1 * | 2/2003 | Fukuda | 430/311 |
| 6,806,037 B2 * | 10/2004 | Goldbach et al. | 430/314 |
| 2004/0047109 A1 * | 3/2004 | Baik | 361/301.1 |
| 2005/0042527 A1 * | 2/2005 | Pierrat | 430/5 |
| 2005/0136340 A1 * | 6/2005 | Baselmans et al. | 430/5 |

FOREIGN PATENT DOCUMENTS

JP 2001-042545 2/2001

* cited by examiner

Primary Examiner—Mark F Huff
Assistant Examiner—Rashid Alam
(74) Attorney, Agent, or Firm—Young & Thompson

(57) ABSTRACT

Formation of a constricted portion in an interconnect pattern is inhibited while moderating design rule for a phase shifting mask. When an interconnect pattern including a plurality of straight lines that are arranged in parallel is formed in a photoresist film on or over a wafer, the process thereof comprises: providing different phase apertures 114 and 116 in longitudinal external side of the interconnect apertures 110 and 112 in the phase shifting mask 100, the different phase aperture providing a phase of light that is different from a phase of light through the interconnect apertures 110 and 112; transferring a basic pattern in the photoresist film via an exposure by using the phase shifting mask 100, the basic pattern containing the interconnect pattern and a temporary pattern formed from an end of the interconnect pattern toward a longitudinal external side thereof; and transferring a temporary pattern in the photoresist for removing the temporary pattern from the basic pattern via an exposure by using a trim mask.

13 Claims, 39 Drawing Sheets

METHOD OF FORMING PATTERN

This application is based on Japanese patent application No. 2005-323,604, the content of which is incorporated hereinto by reference.

BACKGROUND

1. Field of the Invention

The present invention relates to a method for patterning a sacrificial film on or over a wafer, which involves forming a interconnect pattern including a plurality of parallel straight lines.

2. Related Art

In recent years, a packing density of semiconductor integrated circuits is progressed, and a minimum design rule for circuit elements and interconnects is on the order of sub-100 nm. This requires a short wavelength light such as KrF or ArF laser in a photolithographic technology for transferring a pattern of a mask in a photoresist film on a wafer. Since the short wavelength of the resolution light is needed, there requires a break through in the photolithographic technology, and therefore the shrinking in size of patterns such as interconnect lines including gate electrode lines becomes difficult.

A phase shift mask technology, which is capable of preventing the contrast reduction of a photographic image by suitably changing a phase of the light transmitted through the mask, is proposed in order to proceed the scaling of the semiconductor devices. It is typically known such technology as a Levenson phase shifting mask, which is called after an inventor M. D. Levenson.

FIG. 37 is a plan view of a region containing a corner of the mask aperture pattern in a conventional phase shifting mask. As shown in FIG. 37, a Levenson phase shifting mask 500 is configured that the phase angle of a light passed through one aperture 510 is different from phase angle of a light passed through other aperture 512 by 180° (π) in a region of a pair of apertures 510 and 512 across an opaque region. This achieves absolutely zero intensity of light in the opaque region, when an image is formed on the wafer. In FIG. 37, the aperture 510 for 0° (reference) transmitted light is shown as a plain region, the aperture 512 for 180° (π) transmitted light is shown as a hatched region, and the opaque region is shown as a screen-tone region. In addition to above, such Levenson phase shifting mask 500 includes a peripheral opaque region 520.

FIG. 38 is a diagram, illustrating a pattern formed in a photoresist film after a light exposure by using a phase shifting mask. As shown in FIG. 38, a photoresist film 600 includes a portion of an interconnect pattern 602 and other portions, which should be removed. Thereafter, an additional light exposure process is conducted by employing a trim mask to expose on above-mentioned peripheral opaque region 520, so that a final interconnect pattern 602 is formed in the photoresist film 600.

When the phase shifting mask 500 is employed, some problems arise such as the reduction or constriction of the line width on the edge of the pattern as shown in FIG. 38 and FIG. 39. When the area having the constriction or reduction of the line width is a gate electrode area, the gate width becomes narrow at the constriction portion, thereby changing the properties of a metal oxide semiconductor field effect transistor (MOSFET) from the designed properties. Therefore, various efforts are made to prevent such a pattern constriction and a line width reduction.

A technology for the countermeasures is described in Japanese Patent Laid-Open No. 2001-42,545. In Japanese Patent Laid-Open No. 2001-42,545, dark rectangular assist figures are added to the mask aperture pattern edges in the vicinity of the corners to increase a width of the interval between the adjacent apertures, where the interval corresponds to a line width in photoresist film.

SUMMARY OF THE INVENTION

Nonetheless, an optical proximity correction (OPC) process described in Japanese Patent Laid-Open No. 2001-42, 545 significantly depends upon various conditions of the mask. While the appropriate size of the assist pattern features be necessarily changed in accordance with the wave length of light, numerical aperture (NA) of optical lens, NA ratio (σ) between the optics for illumination and the optics for image formation or the like, the appropriate size of the assist pattern features also depends upon width of the aperture and length of the aperture, so that the size of the assist pattern features should be properly determined so as to conform these values related to the mask. As such, the method described in Japanese Patent Laid-Open No. 2001-42,545 is not beneficial, since a complex procedure is required for calculating appropriate sizes of the pattern corresponding to respective sizes of the interconnect lines, and more shrunken design rule is required for accurately designing the mask.

According to one aspect of the present invention, there is provided a method of forming a pattern, in which an interconnect pattern including a plurality of straight lines that are arranged in parallel is formed in the sacrificial film on or over a wafer by exposing thereof to light through a phase shifting mask, said phase shifting mask having interconnect apertures that extend toward a predetermined direction and are arranged in parallel, and said phase shifting mask also being configured that transmitted lights of two different phases are alternately assigned in the interconnect aperture, said method comprising: providing a different phase aperture in a longitudinal external side of said interconnect aperture in said phase shifting mask, said different phase aperture providing a phase of transmitted light that is different from a phase of light through the interconnect aperture; transferring a basic pattern in the sacrificial film via an exposure by using said phase shifting mask, said basic pattern containing said interconnect pattern and a temporary pattern formed from an end of said interconnect pattern toward a longitudinal external side thereof; and transferring a temporary pattern in a photoresist film for removing said temporary pattern from said basic pattern via an exposure by using a trim mask.

The temporary pattern is the portion to be removed at last, but the pattern is present after first exposure process.

According to the method for forming pattern according to the above-described aspect of the invention, the phase shifting mask is configured that the different phase apertures are arranged with predetermined spacings therebetween around the width direction-peripherals of respective interconnect apertures, and the different phase apertures are arranged with predetermined spacings therebetween around the longitudinal direction-peripherals of respective interconnect apertures. More specifically, when a basic pattern is transferred in the sacrificial film via the exposure process through the phase shifting mask, respective interconnect patterns included in the basic pattern exhibit similar optical conditions both in the longitudinal direction-center and in the longitudinal direction-end, so that a generation of a constricted portion in the longitudinal direction-end of the interconnect pattern be inhibited, thereby providing substantially straight width direction-peripheral of the interconnect pattern. The exposure process through the phase shifting mask also provides forming the temporary pattern in the sacrificial film, in addition to the respective lines in the interconnect pattern. Thereafter, the exposure process through the trim mask is conducted to transfer the trimming pattern in the sacrificial film for removing the temporary pattern, and then, the temporary pattern is removed to obtain the interconnect pattern on the sacrificial film.

In the conventional technology, a line pattern is constricted around the corner of the aperture, since the optical condition of the corner of the aperture is different from that in the center of the aperture. More specifically, a pair of aperture regions is formed across the opaque region in the central portion thereof, and the phase of light passed through one aperture is inverse of the phase of light passed through the other aperture, and such optical conditions are also achieved around the corner of the aperture.

According to the present invention, a creation of the constricted portion can be inhibited without adding an assist opaque region in the inside of the aperture on the phase shifting mask. As a result, a complex procedure is not required to calculate appropriate aperture sizes for respective line pattern sizes. Here, concerning the inversed-phase aperture in the phase shifting mask, a pattern corresponding to such aperture is transferred in the photoresist film or the hardmask film as at least a portion of the temporary pattern, and then is eventually removed via the exposure process through the trim mask. By adding the different phase aperture the design rule for the phase shifting mask does not become severe, and thus this technology is extremely advantageous for the practical use.

BRIEF DESCRIPTION OF THE DRAWING

The above and other objects, advantages and features of the present invention will be more apparent from the following description taken in conjunction with the accompanying drawings, in which.

DETAILED DESCRIPTION OF THE PREFERRED EMBODIMENT

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments of processes for forming pattern according to the present invention will be described as follows in further detail, in reference to the annexed figures. In figures, identical numeral is assigned to an element commonly appeared in the figures, and redundant descriptions thereof will not be presented. Further, while hatched lines, dotted lines, screen tone and the like are drawn for indicating an aperture in a mask in the respective figures, these are drawn for the purpose of description, and a portion indicated by hatched lines, dotted lines, screen tone or the like do not necessarily form a cross section.

First Embodiment

Figure 1:
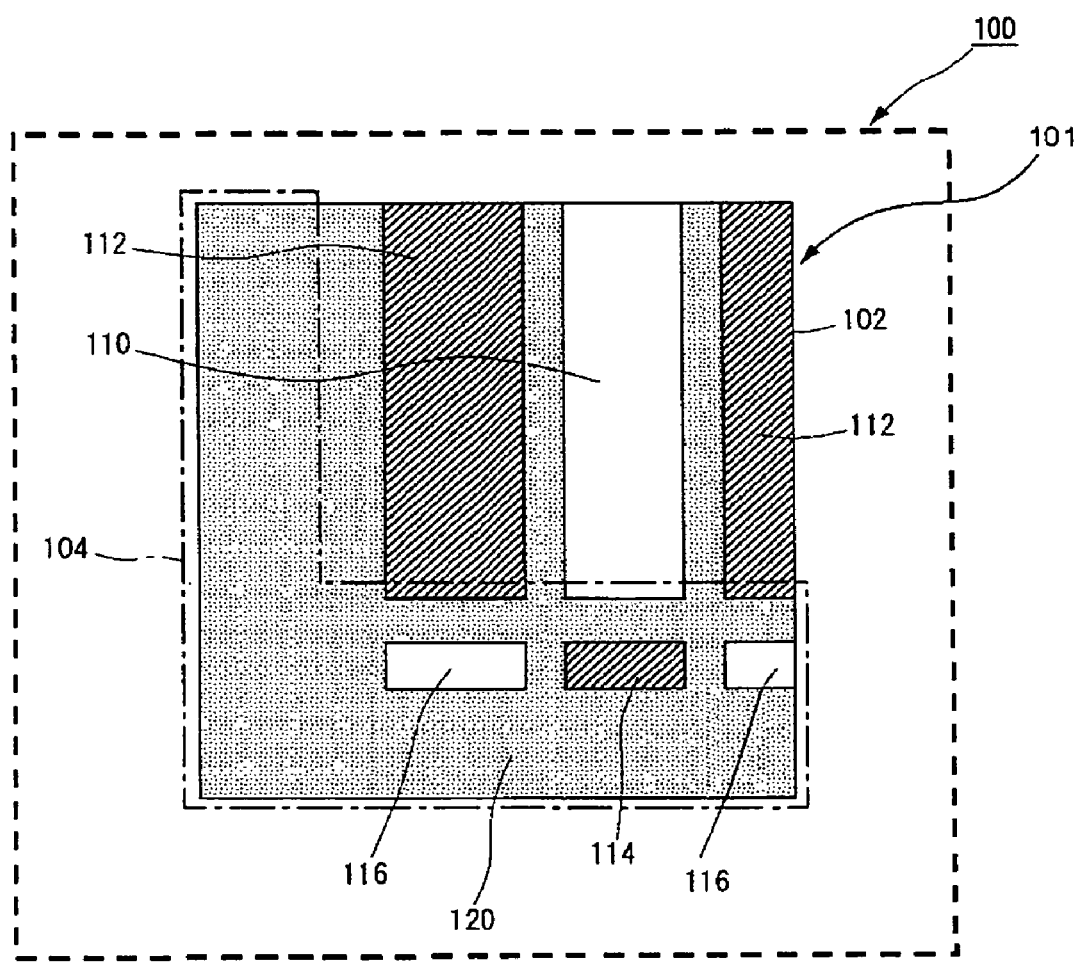
FIG. 1 is a partially-enlarged view of region containing a corner of a mask pattern of a phase shifting mask according to first embodiment.
Figure 2:
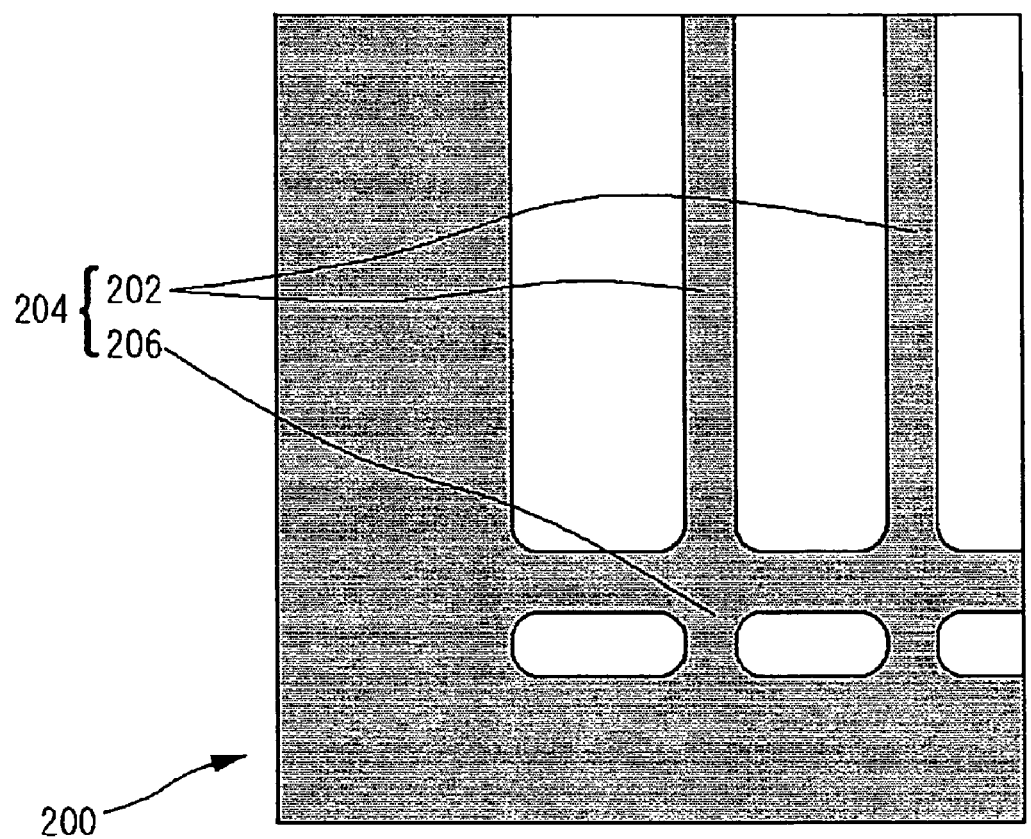
FIG. 2 is a partially enlarged view of a pattern formed in a photoresist film after an exposure by using the phase shifting mask.
Figure 3:
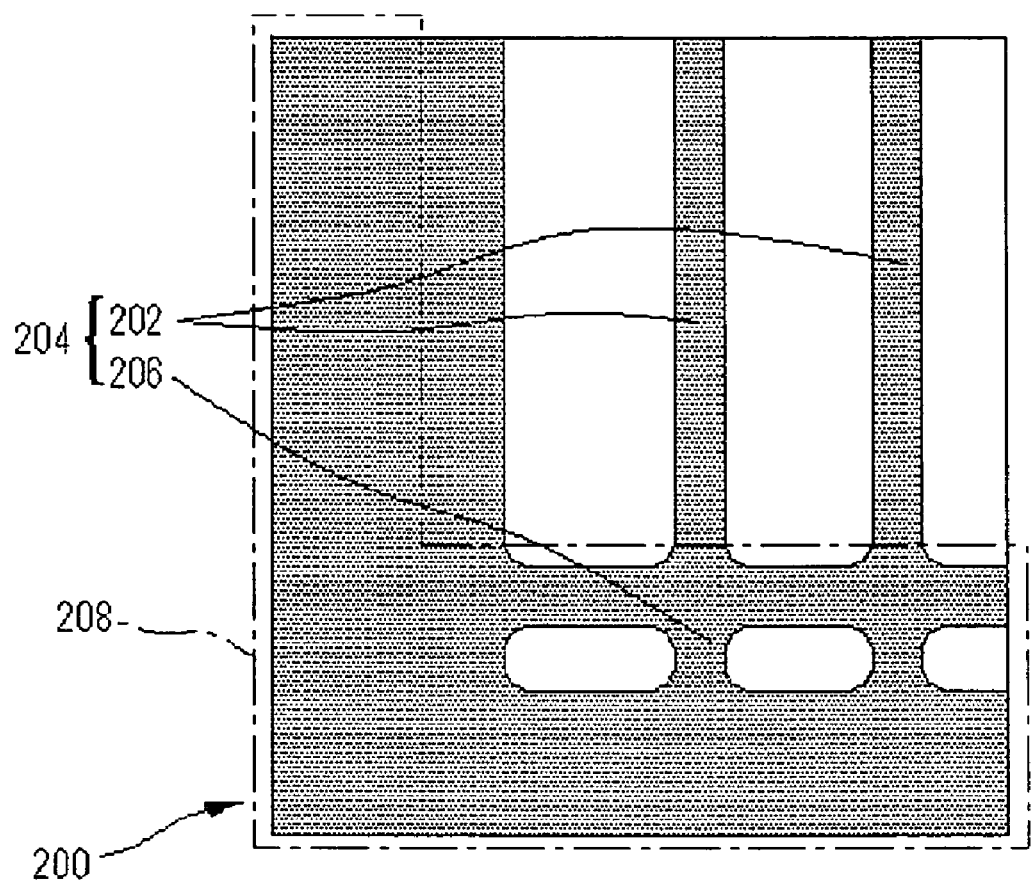
FIG. 3 is a partially enlarged view of a pattern formed in a photoresist film, illustrating a trimming region removed via a process employing a trim mask.
Figure 4:
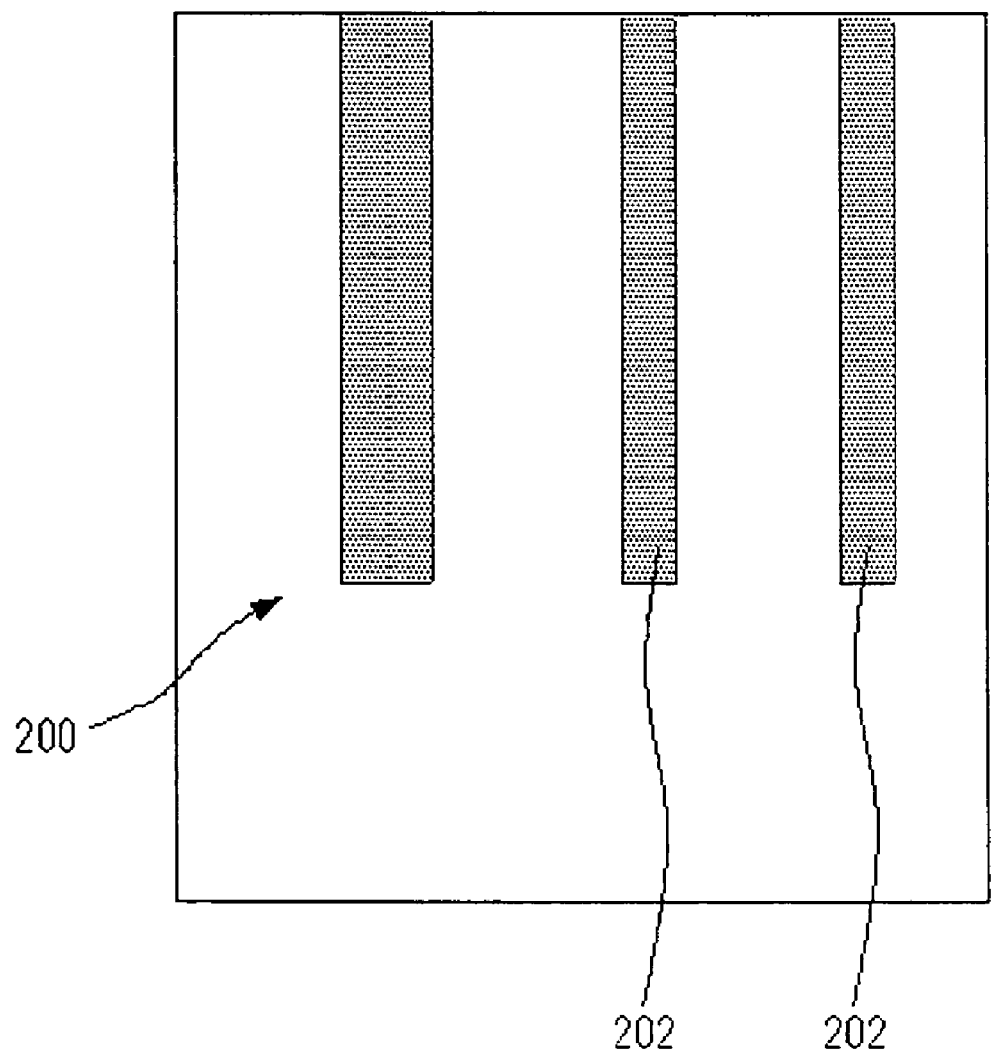
FIG. 4 is a partially enlarged view of a pattern formed in a photoresist film after an exposure by using the trim mask.
Figure 34:
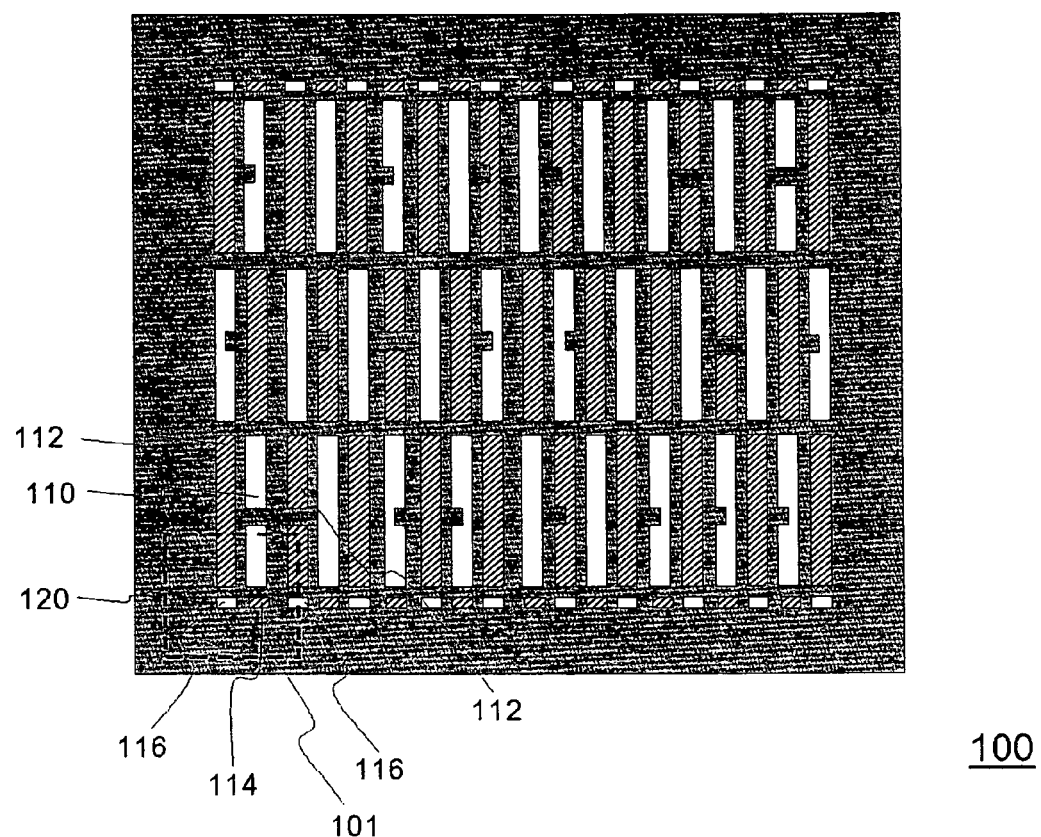
FIG. 34 is a plan view of a phase shifting mask according to first embodiment.
Figure 35:
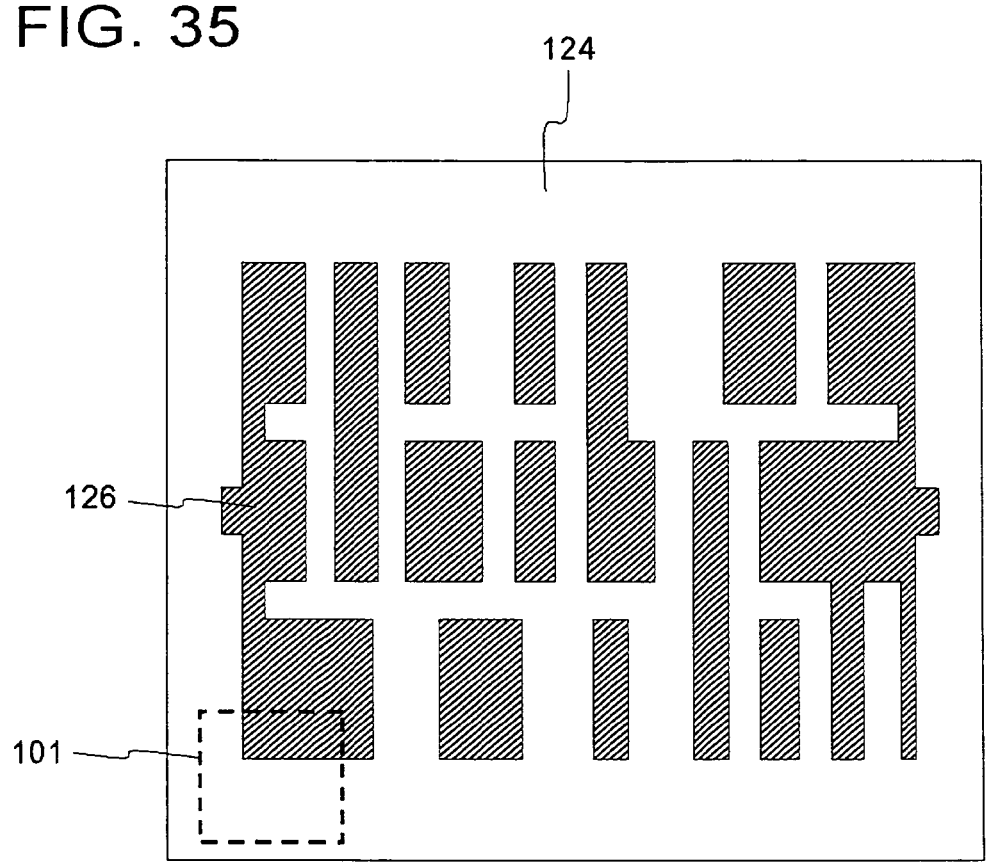
FIG. 35 is a plan view of a trim mask.
Figure 36:
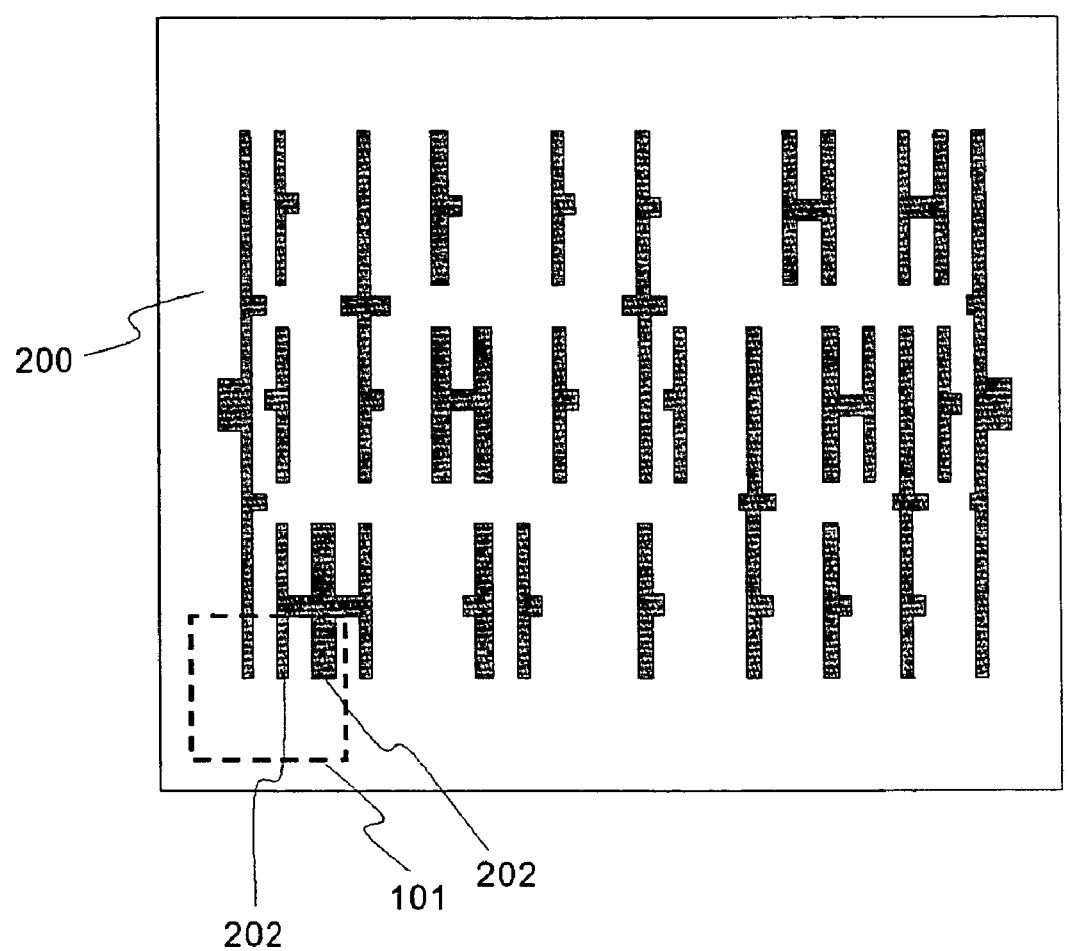
FIG. 36 is a plan view of a pattern formed in a photoresist film after an exposure by using the trim mask.
Figure 37:
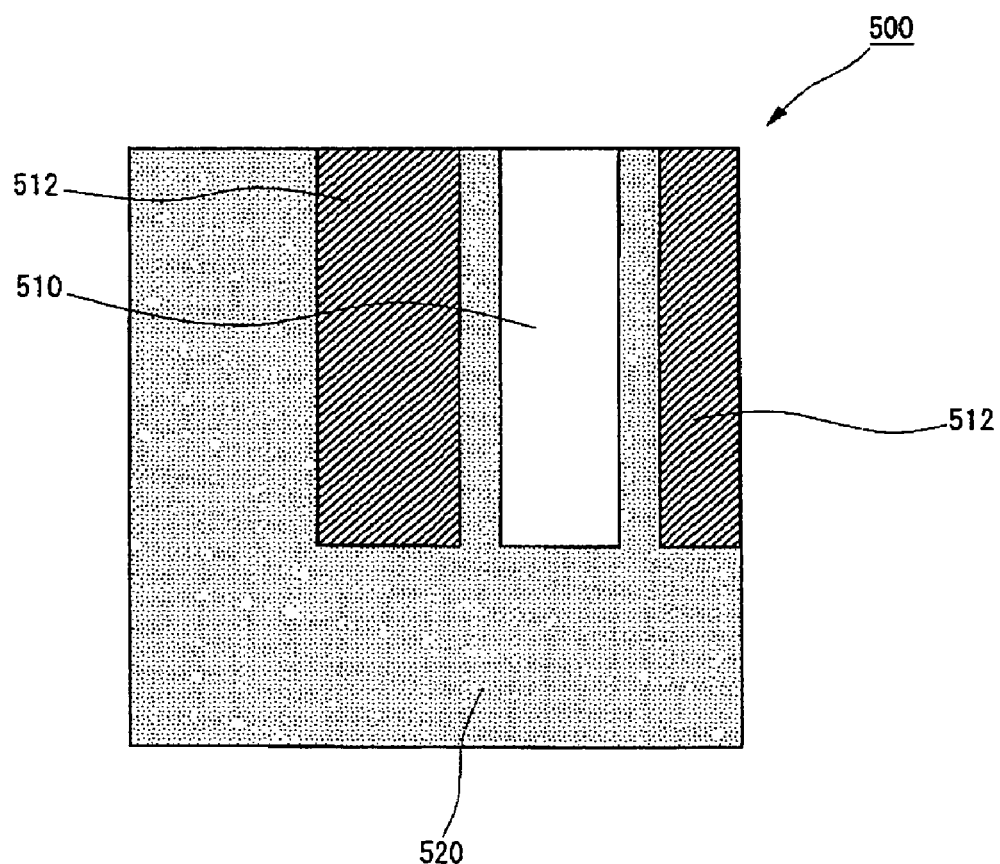
FIG. 37 is a partially enlarged view of a conventional phase shifting mask.
Figure 38:
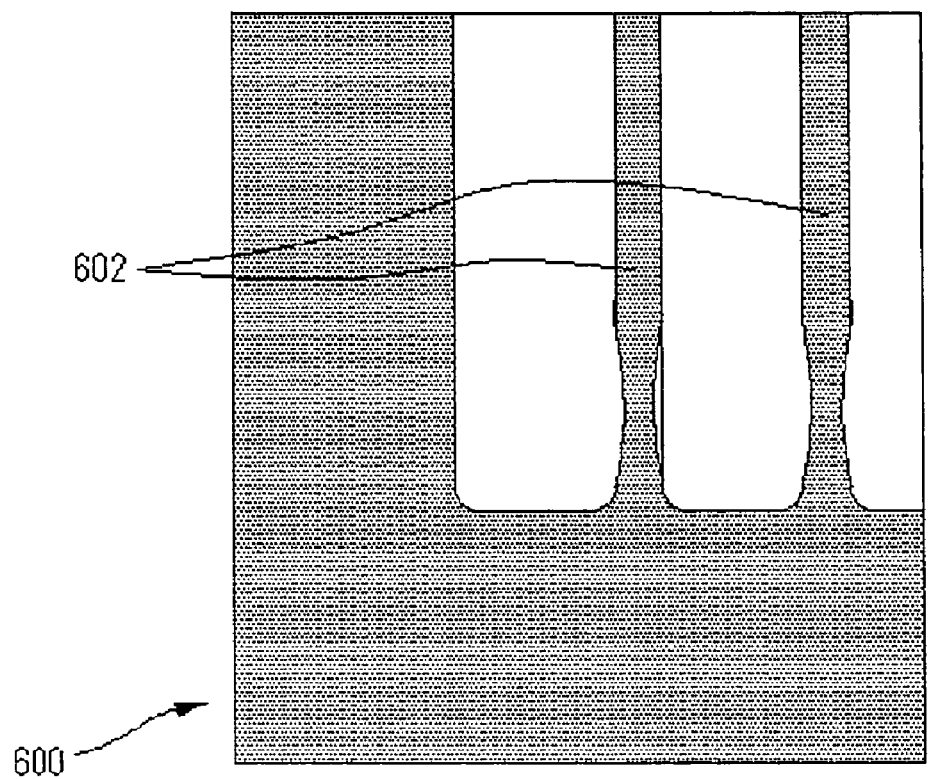
FIG. 38 is a partially enlarged view of a conventional pattern formed in a photoresist film after an exposure by using the phase shifting mask.
Figure 39:
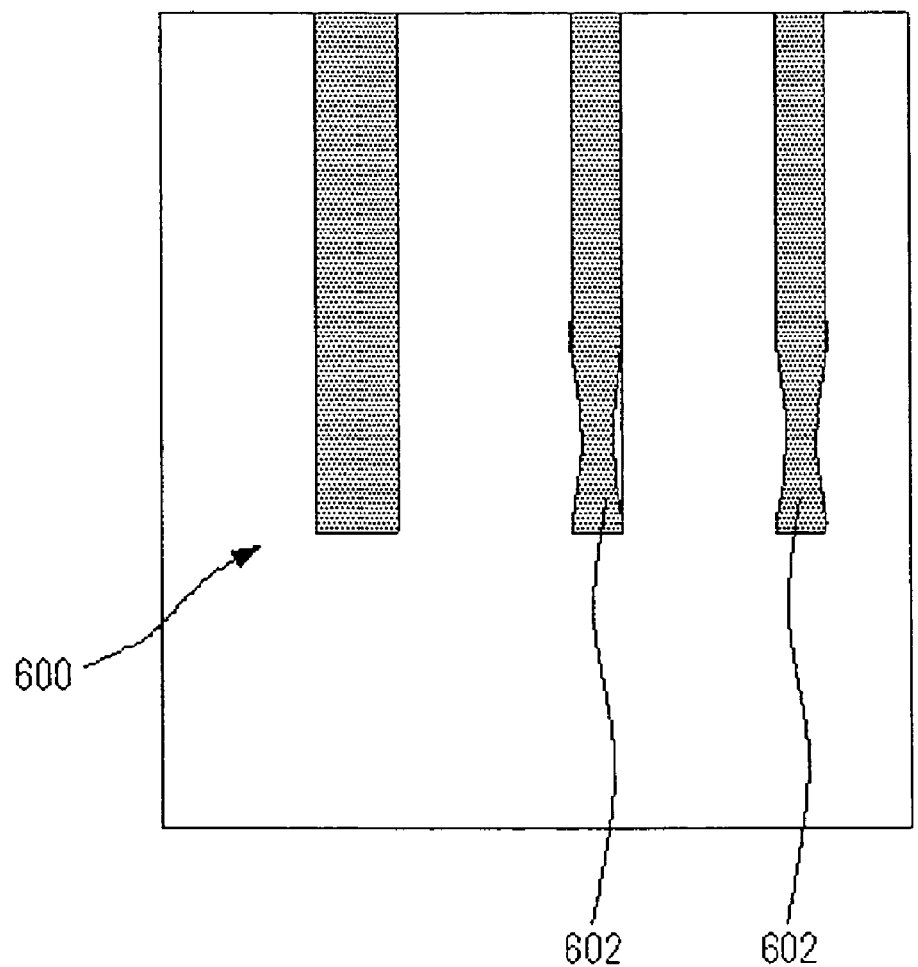
FIG. 39 is a partially enlarged view of a conventional pattern formed in a photoresist film after an exposure by using the trim mask.

FIG. 1 to FIG. 4 and FIG. 34 to FIG. 36 illustrate first embodiment of the present invention, and specifically, FIG. 34 is a plan view of a phase shifting mask, FIG. 1 is a partially enlarged view of region containing a corner of a mask pattern of a phase shifting mask in FIG. 34. FIG. 35 is a plan view of a trim mask. FIG. 2 is an enlarged plan view of a pattern, which is formed in a photoresist film after an exposure process through a phase shifting mask, FIG. 3 is an enlarged plan view of a pattern, which is formed in the photoresist film, indicating a trimming region to be removed by a process through a trim mask. FIG. 36 is an enlarged plan view of a pattern, which is formed in the photoresist film after an exposure process through the trim mask, and FIG. 4 is a partially enlarged view of region containing a corner of the pattern in FIG. 36.

Hereinafter, a method of forming a pattern according to the present embodiment will be described as a method of forming a pattern in the region containing a corner of the pattern. In addition, second or third embodiment will be described as first embodiment.

A method of forming a pattern according to the present embodiment involves forming in a photoresist film 200 applied over a wafer an interconnect pattern 202 including a plurality of parallel straight lines as shown in FIG. 4, via an exposure process through a phase shifting mask 100 shown in FIG. 1. As shown in FIG. 1, a phase shifting mask 100 is provided with apertures 110, 112, 114 and 116 formed in a light shielding region, through which light passes, and a pair of different phases is assigned to each of the apertures 110, 112, 114 and 116. The pair of different phases is specifically 0 and π. Further, the phase shifting mask 100 includes a peripheral opaque region 120, and the peripheral portion thereof is configured that the pattern is remained in a photoresist film 200 when an exposure process is conducted (see FIG. 2).

The phase shifting mask 100 is formed to have a substantially tetragonal plan view, and as shown in FIG. 34. The region 101 containing a corner of the mask aperture pattern in the phase shifting mask 100, as shown in FIG. 1, contains a micro-pattern forming region 102 dedicated to form an interconnect pattern 202 inside thereof, and a trimming region 104 outside thereof, where the pattern is removed by a process through a trim mask as discussed later.

The micro-pattern forming region 102 includes interconnect apertures 110 and 112, which extend toward a predetermined direction (e.g., vertical direction in FIG. 1) and are arranged in parallel, and two different phases are alternately assigned to the interconnect apertures 110 and 112. In FIG. 1, the interconnect aperture 110 of phase 0° is shown as a plain region, the interconnect aperture 112 of phase π is shown as a lines hatched region, and the light shielding region including the peripheral opaque region 120 is shown as a points hatched region, except for 110, 112, 114 and 116.

As shown in FIG. 1, a trimming region 104 is configured to overlap the longitudinal end of the respective interconnect apertures 110 and 112, and a final geometry of longitudinal end of the interconnect pattern 202 is provided by a trimming. The longitudinal external side of the respective interconnect apertures 110 and 112 in the trimming region 104 is provided with trimming region apertures 114 and 116, which exhibits a phase that is inverse of a phase of each of the interconnect apertures 110 and 112. More specifically, as shown in FIG. 1, the peripheral opaque region 120 in the phase shifting mask 100 is provided with a trimming region aperture 114 of phase π corresponding to the interconnect aperture 110 of phase 0°, and a trimming region aperture 116 of phase 0° corresponding to the interconnect aperture 112 of phase π. In the present embodiment, the trimming region apertures 114 and 116 serving as a different phase aperture are formed to be spaced apart from the interconnect apertures 110 and 112 with a predetermined spacing therebetween through light shielding region, respectively. Further, the trimming region apertures 114 and 116 are formed to have widths that are substantially the same as the widths of the interconnect apertures 110 and 112, respectively, and light shielding regions are disposed between the adjacent trimming region apertures 114 and 116.

In the method of forming the pattern of the present embodiment, an exposure process through the phase shifting mask 100 is conducted. The pattern formed in the exposure process through the phase shifting mask 100 is composed of an exposed region and an unexposed region in the photoresist film. And then, without a photoresist development, an additional exposure process is conducted through a trim mask 122 containing an exposure region 124 and an opaque region 126, as shown in FIG. 35, in place of the phase shifting mask, thereby removing a temporary pattern 206 in a basic pattern 204 formed by a process through the phase shifting mask 100. A condition of forming the pattern in the photoresist film 200 employing such method of forming the pattern will be described in reference to FIG. 2 to FIG. 4. In FIG. 2 to FIG. 4, a patterned portion formed in the photoresist film via an exposure by using a mask is indicated as a screen-tone region.

First of all, a coherent monochrome light flux having a constant wave length is irradiated over the phase shifting mask 100, so that a light, which have passed through the phase shifting mask 100, is introduced to a condenser lens system having a constant NA. The light, which have passed through the condenser lens system, projects a reduced pattern formed in the phase shifting mask 100 including the apertures 110, 112, 114 and 116, so that the basic pattern 204 is transferred in the photoresist film 200 serving as a sacrificial film formed on or over the wafer. This configuration provides transferring the image including portions corresponding to the apertures 110, 112, 114 and 116, corners of which are rounded, as shown in FIG. 2, and the rest of the portions corresponding to the apertures 110, 112, 114 and 116 forms the basic pattern 204. The basic pattern 204 is composed of an unexposed region in the photoresist film formed in the exposure process through the phase shifting mask 100, and includes the interconnect pattern 202 and a temporary pattern 206 formed from the end portion of the interconnect pattern 202 to the longitudinal external side.

Here, along the width direction, the interconnect apertures 110 and 112 of different phases are arranged with a predetermined spacing therebetween, and along the longitudinal direction, trimming region apertures 114 and 116 of different phases are arranged with a predetermined spacing therebetween. More specifically, the longitudinal center of the interconnect pattern 202 exhibits similar optical condition as the optical condition in the longitudinal-end thereof, so that a generation of a constricted portion in the longitudinal direction-end of the interconnect pattern 202 be inhibited, thereby providing substantially uniform width of the interconnect pattern 202, as shown in FIG. 2.

Next, the phase shifting mask 100 is replaced with a trim mask 122, and an exposure process through the trim mask 122 is conducted. A trimming pattern 208 for removing the pattern 206 in the basic pattern 204 is transferred in the photoresist film 200 by conducting such exposure process. In the present embodiment, the photoresist film, on which the basic pattern 204 is transferred via the exposure process through the phase shifting mask 100 and the photoresist film, on which the trimming pattern 208 is transferred via the exposure process through the trim mask are the same photoresist mask.

That is, the temporary pattern 206 unexposed in the exposure process through the phase shifting mask 100 is exposed by exposure process through the trim mask 122, and only the interconnect pattern 202 in the basic pattern 204 remains as the unexposed region after photoresist development. More specifically, the peripheral portion in the basic pattern 204 indicated by the region of the dotted lines in FIG. 3 is removed to form the interconnect pattern 202 shown in FIG. 4.

As such, according to the method of forming the pattern of the present embodiment, the pattern formed in the photoresist film 200 corresponding to the trimming region apertures 114 and 116 is eventually removed via a trimming by the exposure process through the trim mask. Thus, longitudinal-end of the interconnect apertures 110 and 112 exhibits similar optical condition as the longitudinal center thereof, so that a generation of a constricted portion be inhibited.

Therefore, a creation of the constricted portion can be inhibited without a need for adding an assist opaque region in the inside of the interconnect apertures 110 and 112 in the phase shifting mask 100, a complex procedure for calculating appropriate sizes of the pattern 202 corresponding to respective sizes of the interconnect patterns is not required, and thus a severe design rule for the phase shifting mask 100 is eased.

Further, the trimming region apertures 114 and 116 in the phase shifting mask 100 is transferred in the photoresist film 200 as a portion of the pattern 206 to be removed, and as shown in FIG. 4, is eventually removed via an exposure by using the trim mask. Therefore, the design rule for the phase shifting mask 100 does not become severe by the formation of the trimming region apertures 114 and 116. Since the interconnect apertures 110 and 112 have widths that are substantially the same as the width of the trimming region apertures 114 and 116 in the present embodiment, the trimming region apertures 114 and 116 can be formed by applying the design rule for the interconnect apertures 110 and 112, so that the formation of the constricted portion in the interconnect pattern be inhibited, and thus this technology is extremely advantageous on the occasion for the practical use.

Figure 5:
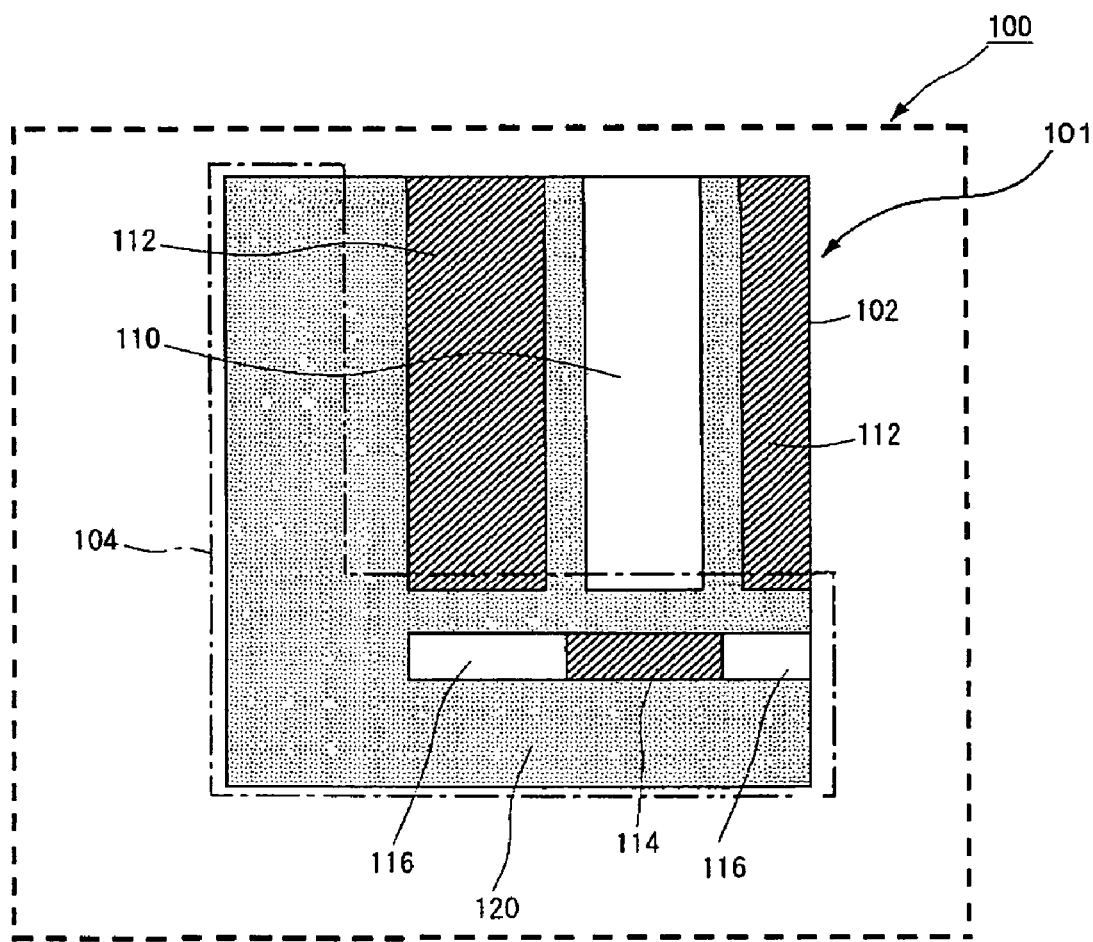
FIG. 5 is a partially enlarged view of a phase shifting mask, illustrating a configuration of a modified embodiment.

While the configuration of disposing the light shielding region interposed between the adjacent trimming region apertures 114 and 116 is illustrated in first embodiment, the adjacent trimming region apertures 114 and 116 may be continually disposed as shown in FIG. 5, for example, without disposing the light shielding region therebetween. In the configuration shown in FIG. 5, trimming region apertures 114 and 116, each of which exhibits a different phase, are formed to have larger widths than the corresponding interconnect apertures 110 and 112, respectively. As described above, maximum width-directional dimensions of the trimming region apertures 114 and 116 are ensured without providing a light shielding region, so that generations of distortions in the interconnect apertures 110 and 112 can be more effectively inhibited.

If the apertures of different phases are arranged so as to be in contact with each other, a defect may possibly be generated and thus an abnormal resolution pattern may be created, and consequently it is inhibited to arrange the apertures of different phases so as to be in contact with each other, in the ordinary patterning process. Nevertheless, since the entire pattern is removed in the trimming region 104, obstacles are not created, if the trimming region apertures 114 and 116 are arranged so as to be in contact with each other, as shown in FIG. 5.

While the configuration of disposing the trimming region apertures 114 and 116 spaced apart from the interconnect apertures 110 and 112 interposing the light shielding region therebetween is illustrated in first embodiment, at least one of the interconnect apertures 110 and 112 may be alternatively arranged continually with the trimming region apertures 114 and 116, which are arranged in a longitudinal external side of the interconnect apertures 110 and 112, for example, as shown in FIG. 6 to FIG. 11.

Figure 6:
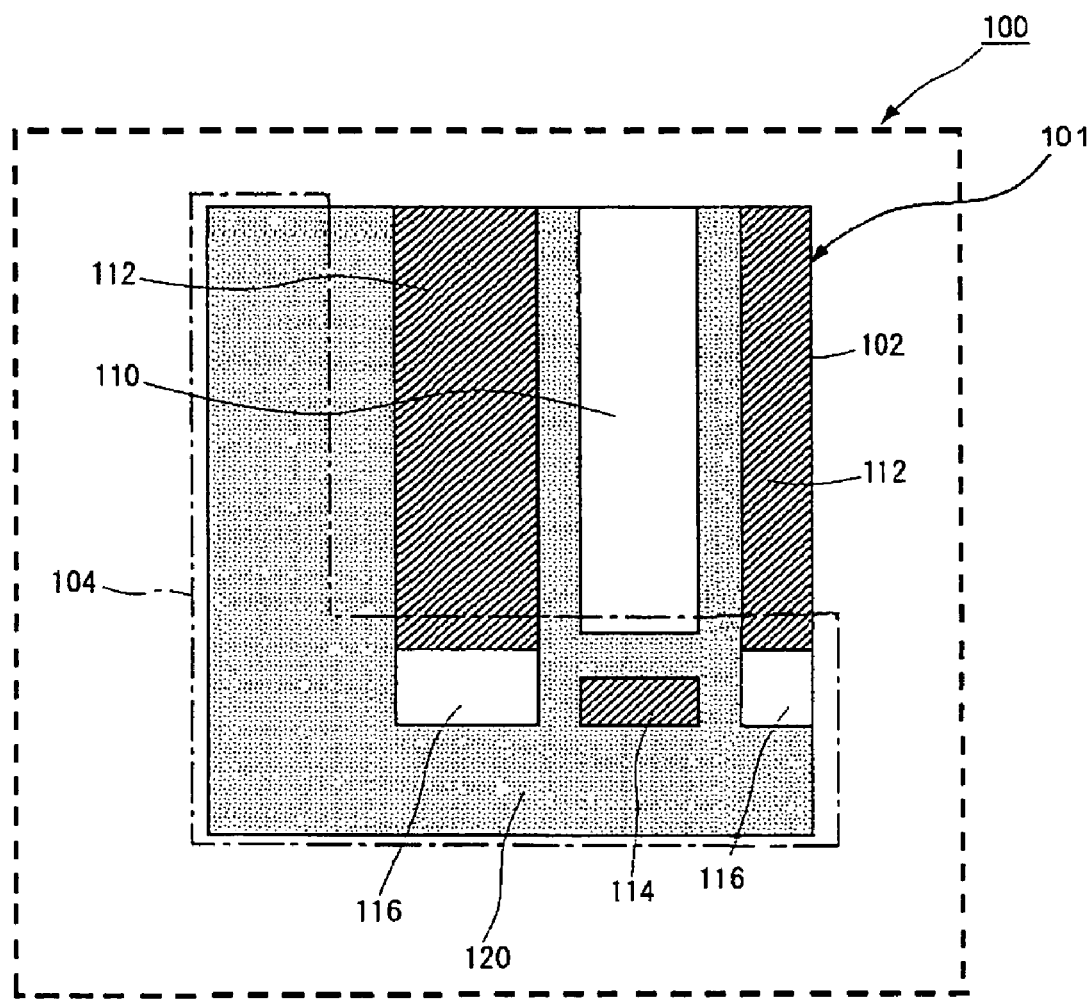
FIG. 6 is a partially enlarged view of a phase shifting mask, illustrating a configuration of a modified embodiment.

FIG. 6 illustrates a configuration that the interconnect aperture 112 of phase π is in contact with the trimming region aperture 116 of phase 0°. In FIG. 6, the interconnect aperture 112 of phase π is extended toward the longitudinal external side of the interconnect aperture 110 of phase 0° so that the interconnect aperture 112 is adjacent to the trimming region aperture 116 of phase 0°. This configuration provides an improved linearity of the interconnect pattern 202 formed in the photoresist film 200. Concerning the interconnect aperture 110 of phase 0°, a light shielding region is interposed with the trimming region aperture 114 of phase π. Such manner is advantageous when the interconnect aperture 112 of phase π is relatively narrow, since sufficient quantity of transmitted light can be ensured by extending the interconnect aperture 112 of phase π toward the longitudinal external side thereof.

Figure 7:
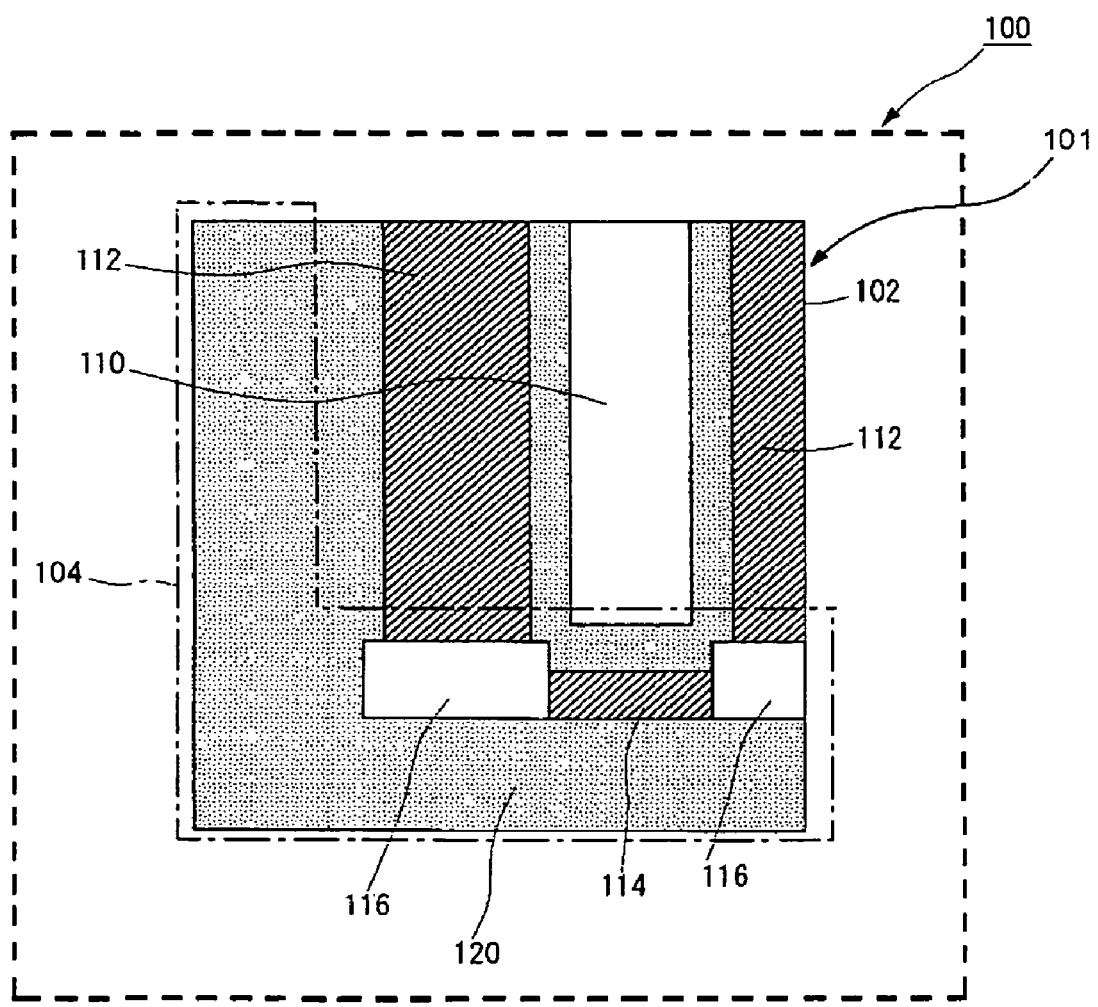
FIG. 7 is a partially enlarged view of a phase shifting mask, illustrating a configuration of a modified embodiment.

While the trimming region apertures 114 and 116 are formed to have widths, which are substantially the same as the widths of the interconnect apertures 110 and 112, respectively, and are disposed across the light shielding region interposed therebetween in the configuration shown in FIG. 6, the trimming region apertures 114 and 116 may be in contact with each other, as shown in FIG. 7. Having this configuration, generations of distortions in the interconnect apertures 110 and 112 can be more effectively inhibited.

Figure 8:
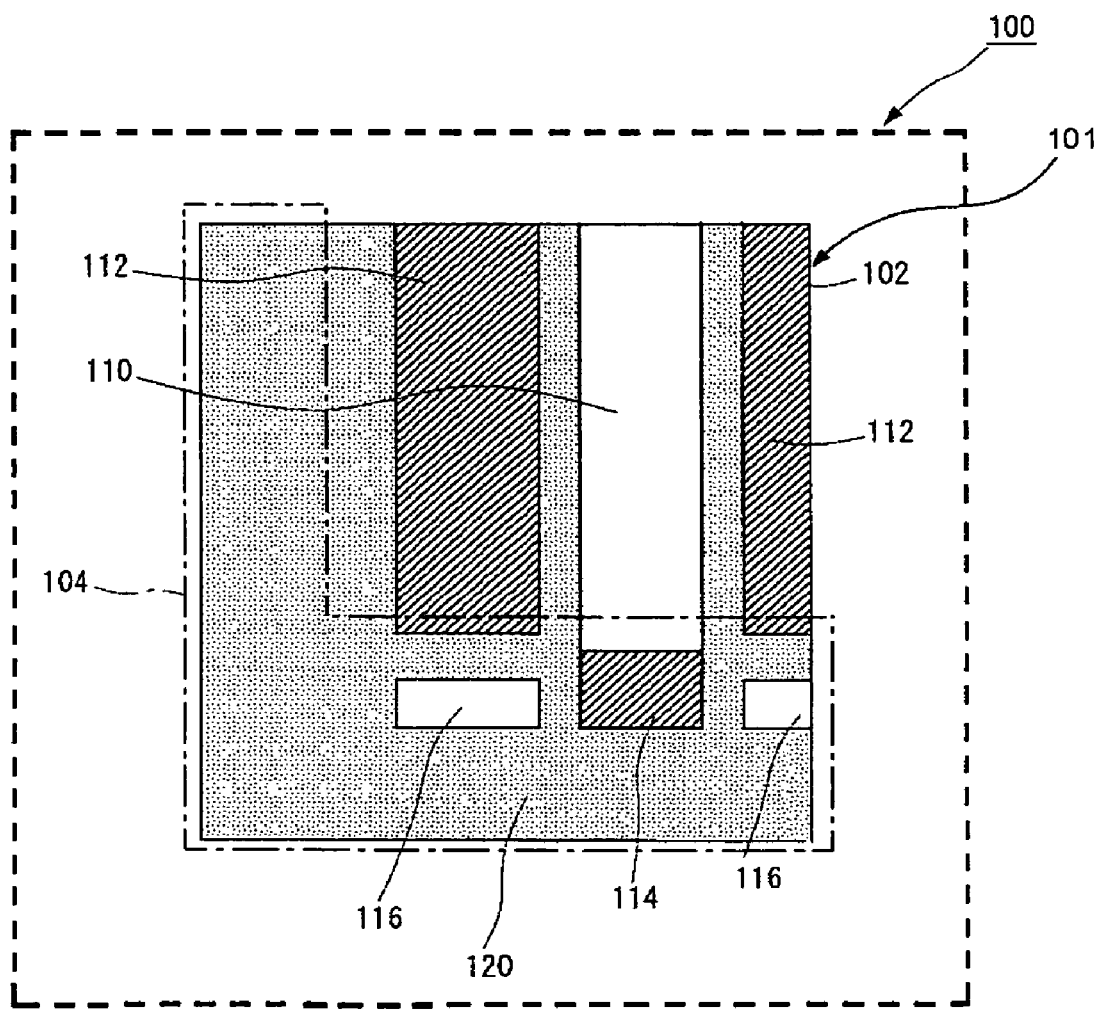
FIG. 8 is a partially enlarged view of a phase shifting mask, illustrating a configuration of a modified embodiment.

Further, as shown in FIG. 8, the interconnect aperture 110 of phase 0° may be configured to be in contact with the trimming region aperture 114 of phase π. In FIG. 8, the interconnect aperture 110 of phase 0° is extended toward the longitudinal external side of the interconnect aperture 110 of phase 0° so that the interconnect aperture 112 is adjacent to the trimming region aperture 114 of phase π. This configuration also provides an improved linearity of the interconnect pattern 202 formed in the photoresist film 200. Concerning the interconnect aperture 112 of phase π, an opaque region is interposed with the trimming region aperture 116 of phase 0°. Such manner is advantageous when the interconnect aperture 110 of phase 0° is relatively narrow, since sufficient quantity of transmitted light can be ensured by extending the interconnect aperture 110 of phase 0° toward the longitudinal external side thereof.

Figure 9:
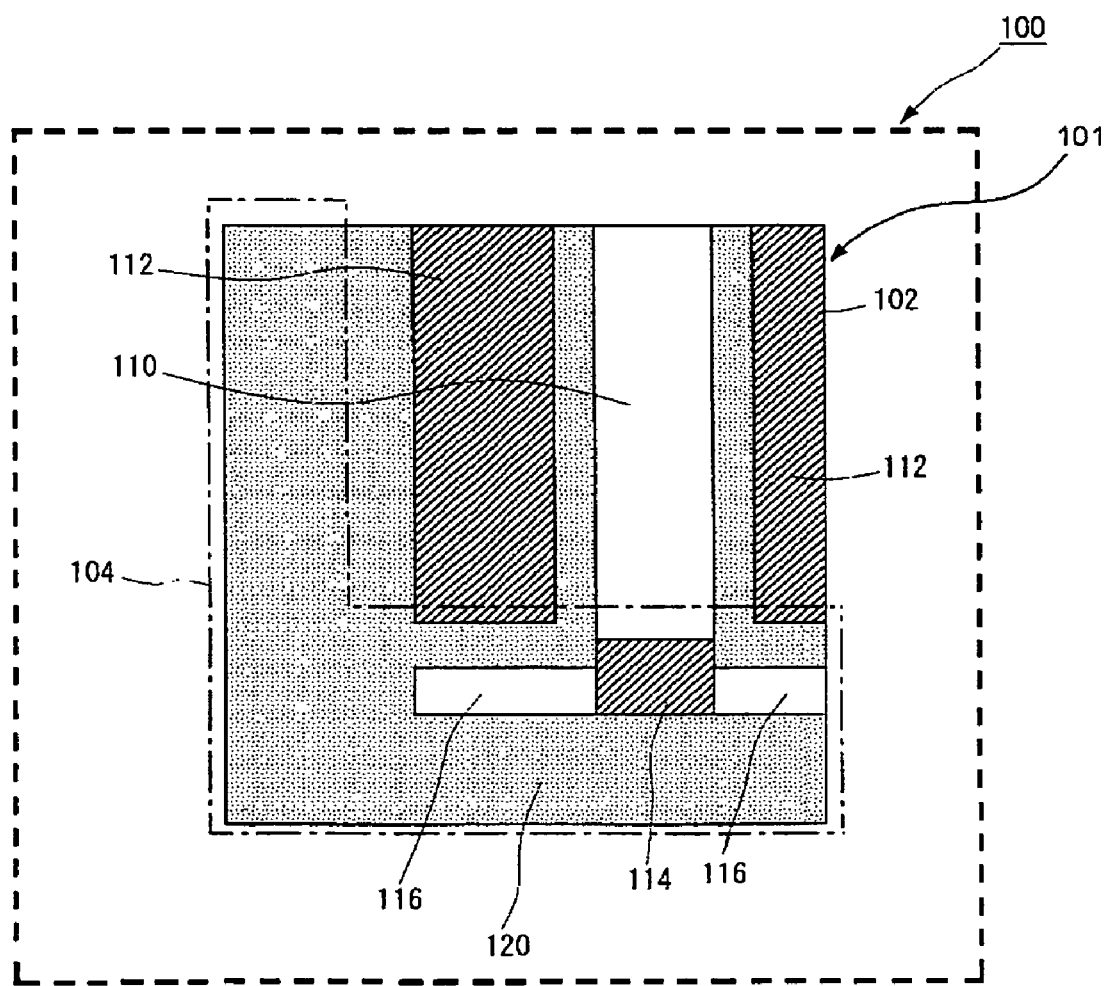
FIG. 9 is a partially enlarged view of a phase shifting mask, illustrating a configuration of a modified embodiment.

While the trimming region apertures 114 and 116 are formed to have widths, which are substantially the same as the widths of the interconnect apertures 110 and 112, respectively, and are disposed across the light shielding region interposed therebetween in the configuration shown in FIG. 8, the trimming region apertures 114 and 116 may be in contact with each other, as shown in FIG. 9. Having this configuration, generations of distortions in the interconnect apertures 110 and 112 can be more effectively inhibited.

Figure 10:
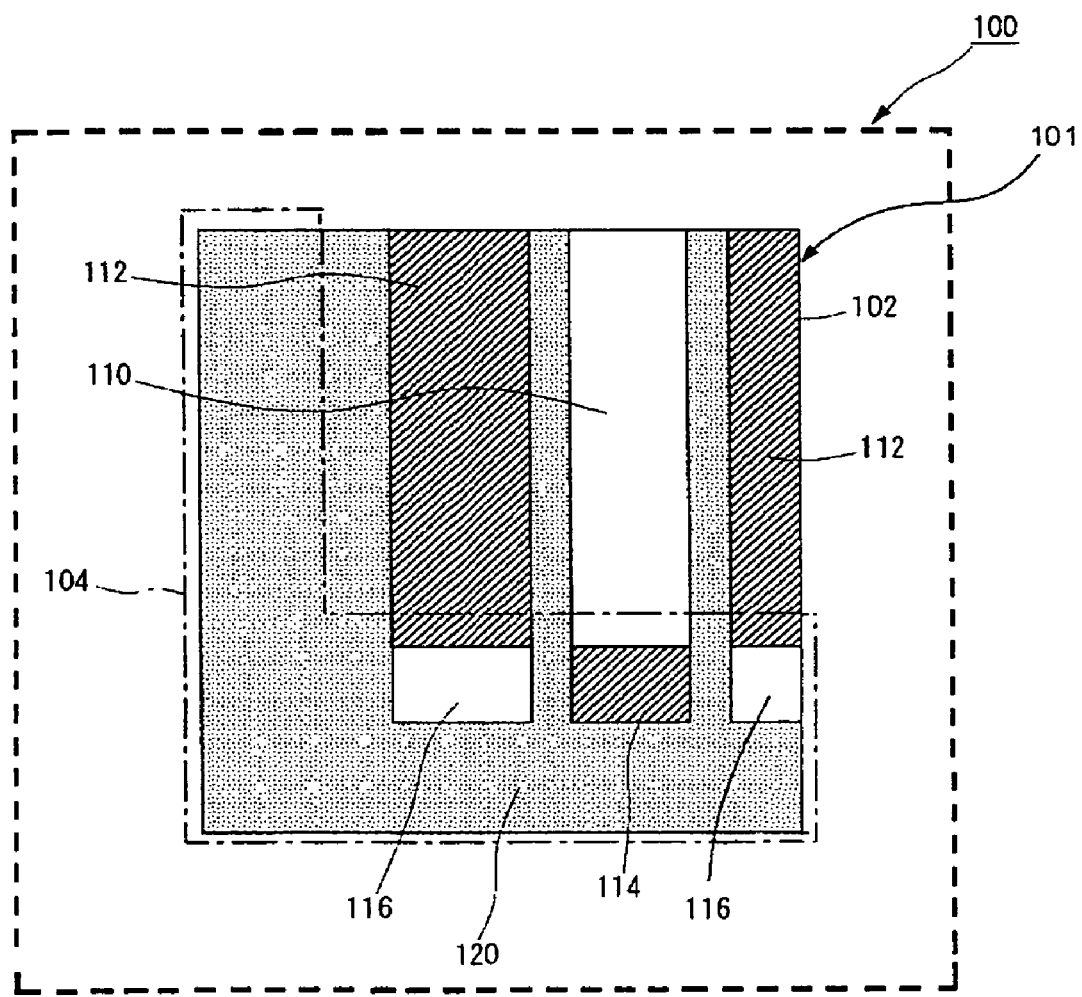
FIG. 10 is a partially enlarged view of a phase shifting mask, illustrating a configuration of a modified embodiment.
Figure 11:
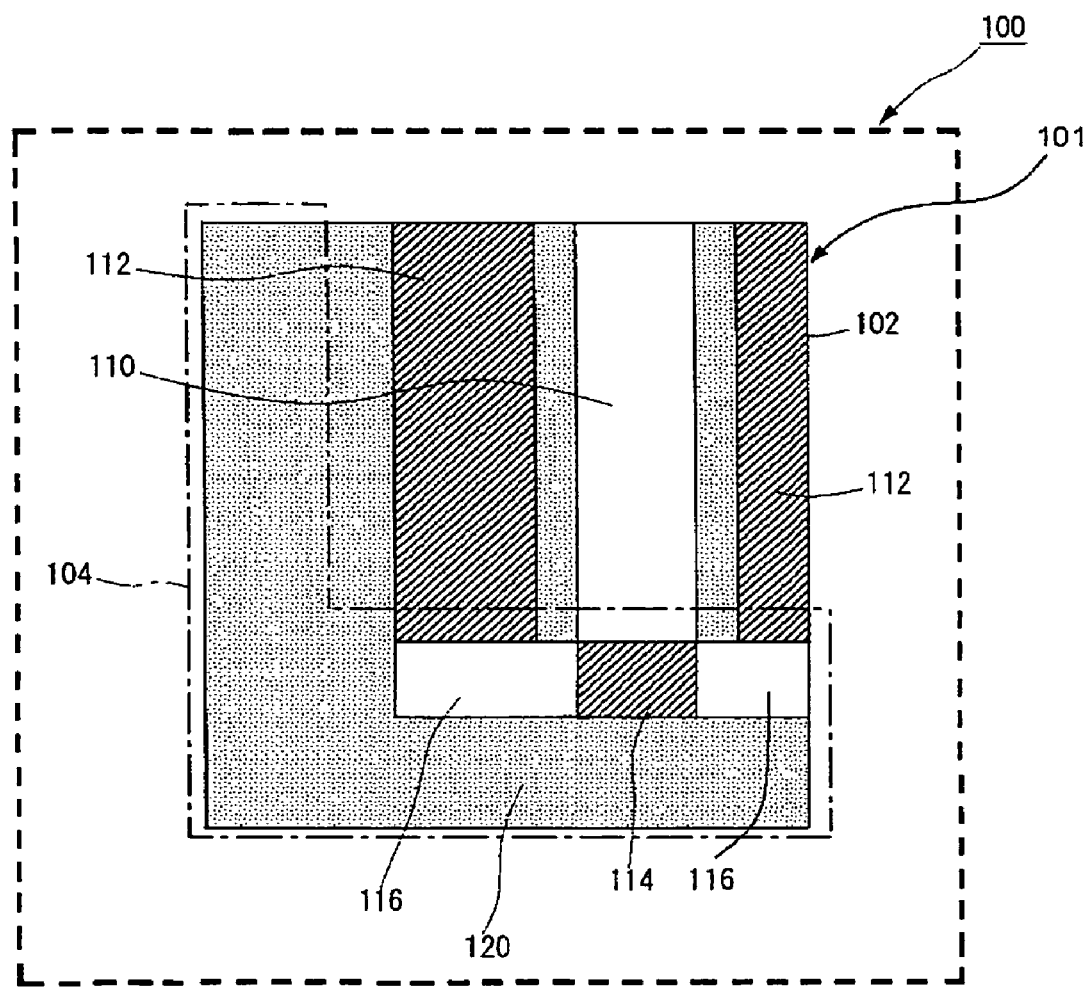
FIG. 11 is a partially enlarged view of a phase shifting mask, illustrating a configuration of a modified embodiment.

Further more, as shown in FIG. 10, both the interconnect aperture 110 of phase 0° and the interconnect aperture 112 of phase π may be configured to be in contact with the trimming region apertures 114 and 116, respectively. In FIG. 10, all the interconnect apertures 110 and 112 are extended toward the longitudinal external side thereof, so that these interconnect apertures are adjacent to the trimming region apertures 114 and 116. This configuration also provides an improved linearity of the interconnect pattern 202 formed in the photoresist film 200. While the trimming region apertures 114 and 116 are formed to have widths, which are substantially the same as the widths of the interconnect apertures 110 and 112, respectively, and are disposed across the light shielding region interposed therebetween in the configuration shown in FIG. 10, the trimming region apertures 114 and 116 may be in contact with each other, as shown in FIG. 11.

Having this configuration, generations of distortions in the interconnect apertures 110 and 112 can be more effectively inhibited.

Second Embodiment

Figure 12:
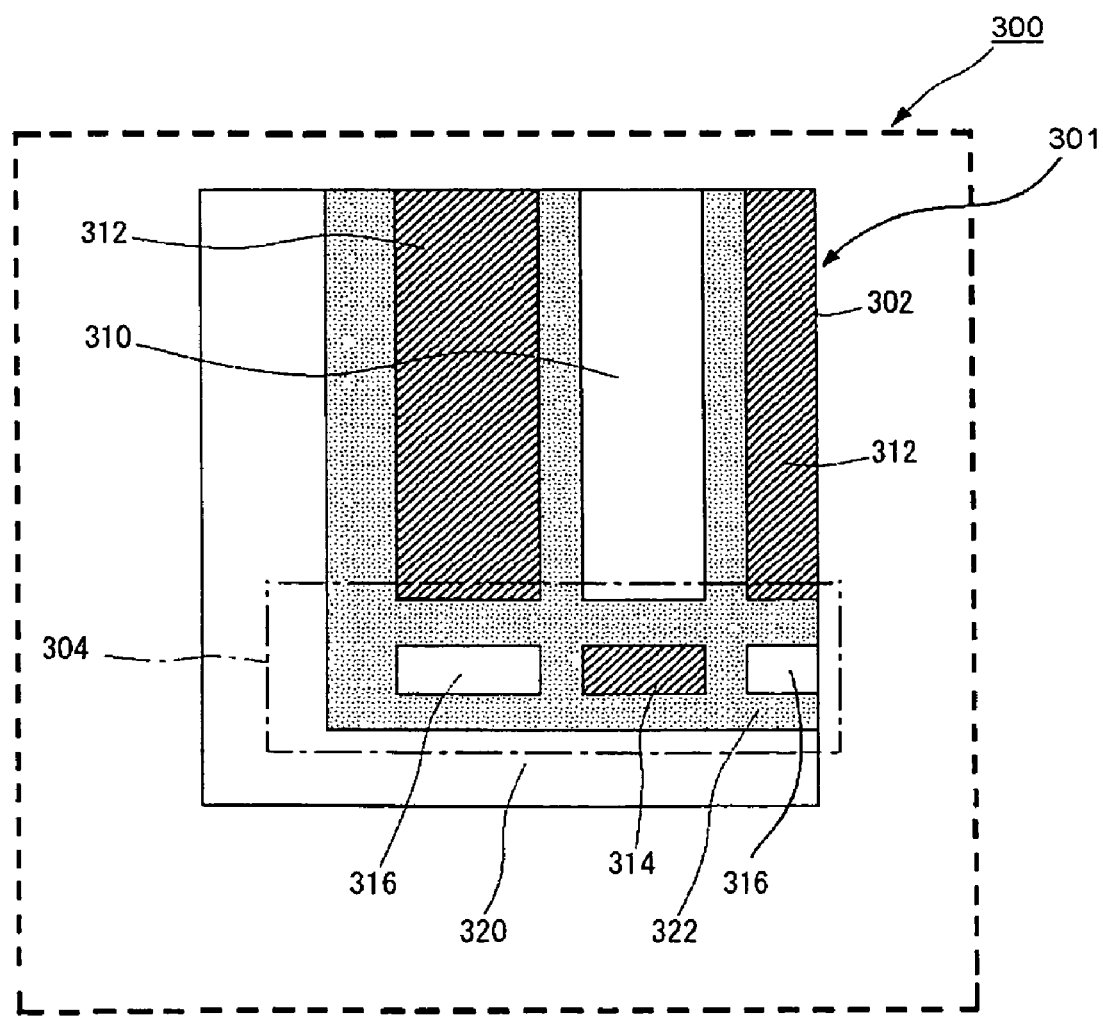
FIG. 12 is a partially enlarged view of a phase shifting mask, illustrating a configuration according to second embodiment.
Figure 13:
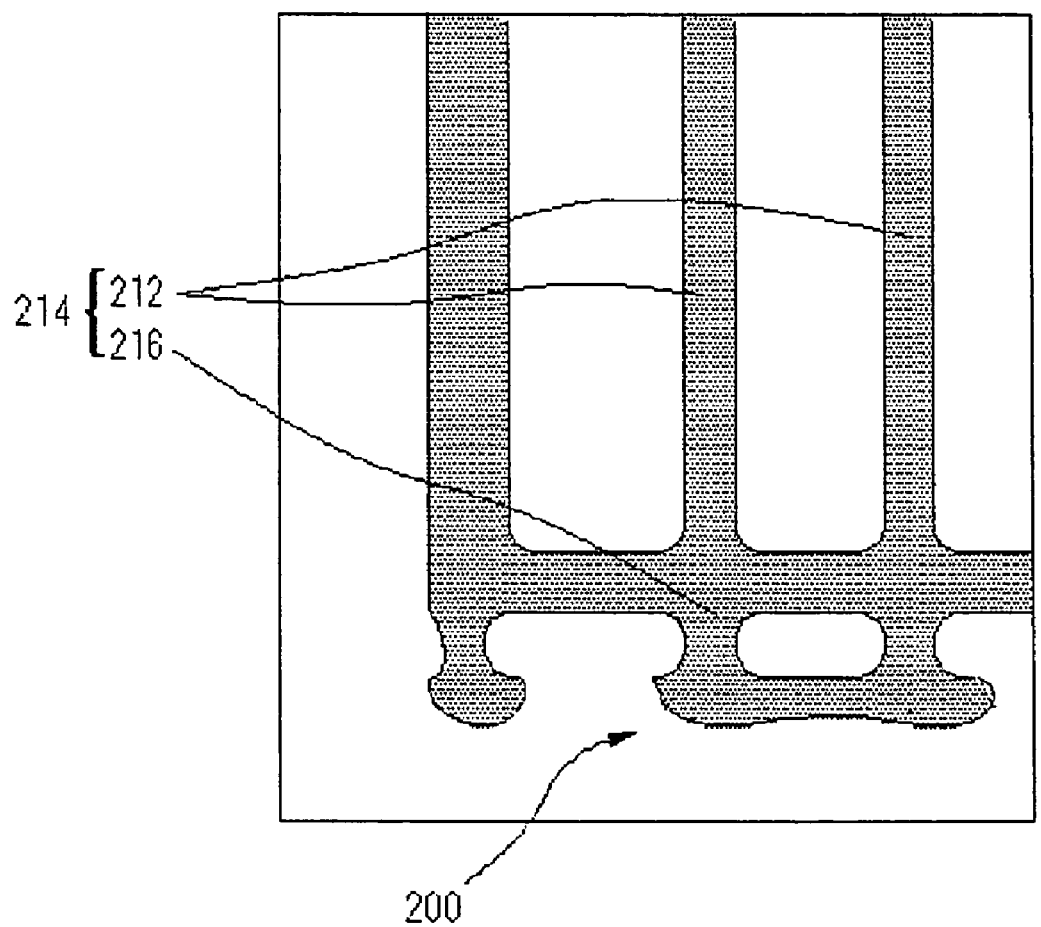
FIG. 13 is a partially enlarged view of a pattern formed in a photoresist film after an exposure by using the phase shifting mask.
Figure 14:
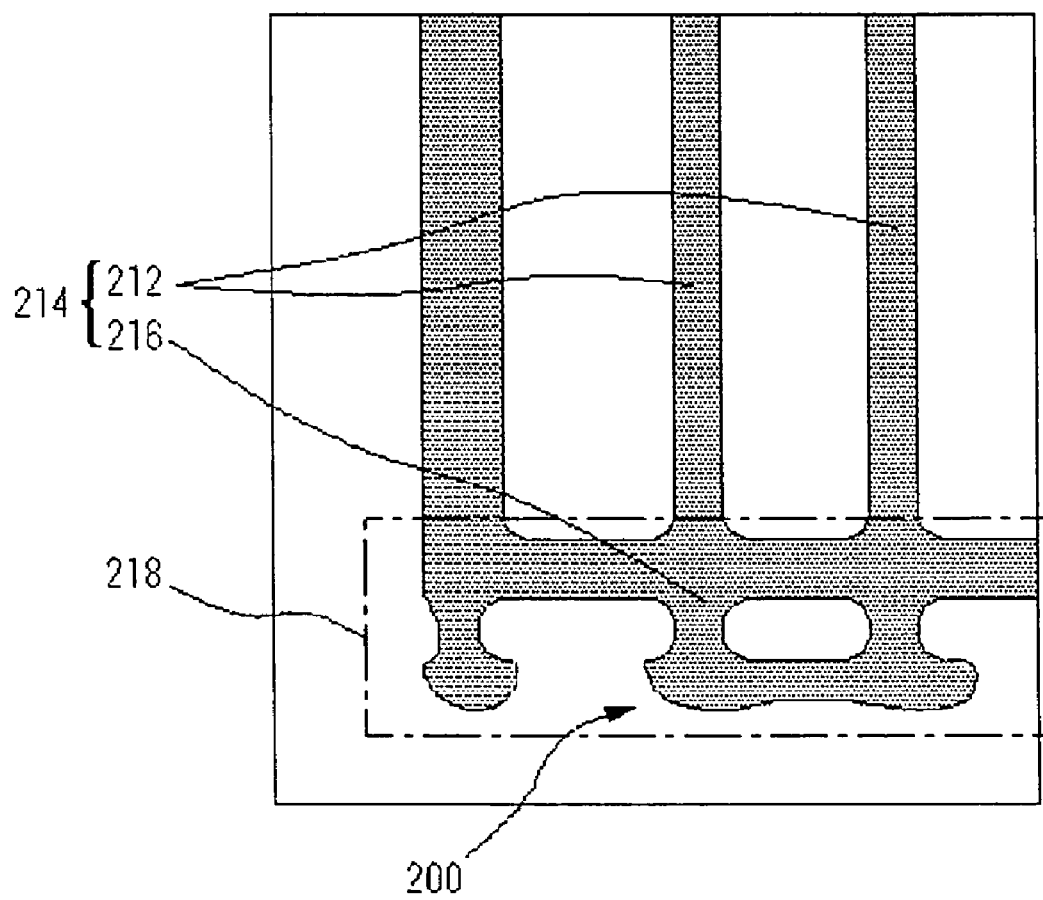
FIG. 14 is a partially enlarged view of a pattern formed in a photoresist film, illustrating a trimming region removed via a process employing a trim mask.
Figure 15:
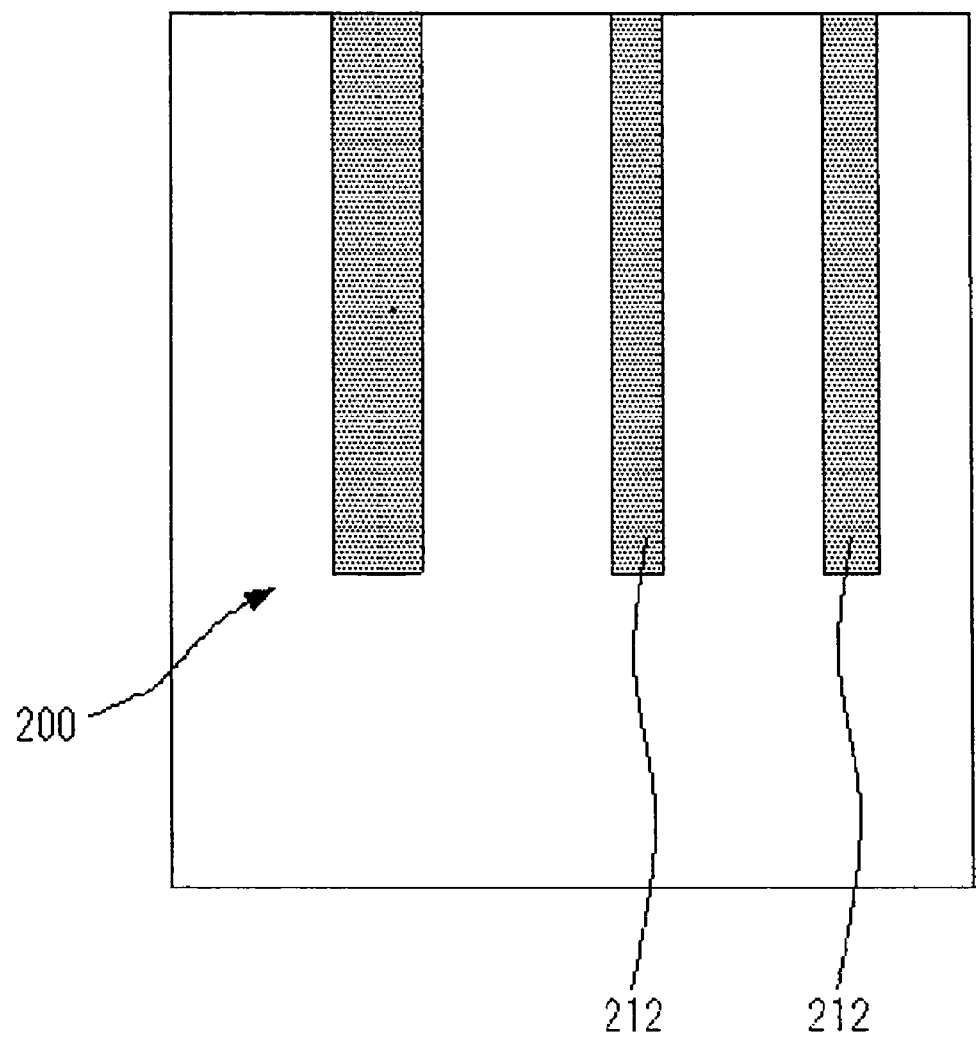
FIG. 15 is a partially enlarged view of a pattern formed in a photoresist film after an exposure by using the trim mask.

FIG. 12 to FIG. 15 illustrate second embodiment of the present invention, and specifically, FIG. 12 is a partially enlarged view of region containing a corner of a mask pattern of a phase shifting mask, FIG. 13 is a partially enlarged plan view of region containing a corner of a pattern, which is formed in a photoresist film after an exposure process through a phase shifting mask, FIG. 14 is a partially enlarged plan view of region containing a corner of a pattern, which is formed in the photoresist film, indicating a trimming region to be removed by a process through a trim mask, and FIG. 15 is a partially enlarged plan view of region containing a corner of a pattern, which is formed in the photoresist film after an exposure process through the trim mask.

A method of forming a pattern according to the present embodiment involves forming in a photoresist film 200 applied over a wafer an interconnect pattern 212 including a plurality of parallel straight lines, via an exposure process through a phase shifting mask 300 shown in FIG. 12. The configuration of the phase shifting mask 300 is same as the configuration of the phase shifting mask 100 of first embodiment, except that a peripheral thereof is an exposure region. More specifically, the phase shifting mask 300 includes a peripheral exposure region 320, and the peripheral portion thereof is configured that no pattern is formed in the photoresist film 200 via the exposure process (see FIG. 13).

As shown in FIG. 12, in region 301 containing a corner of a mask pattern of the phase shifting mask 300, the inside region thereof includes a micro-pattern forming region 302 for forming an interconnect pattern 212. A trimming region 304 is configured to overlap the longitudinal end of the interconnect apertures 310 and 312, and is disposed in a longitudinal outer peripherals of the interconnect apertures 310 and 312. Similarly as in first embodiment, the longitudinal external side of the respective interconnect apertures 310 and 312 in the trimming region 304 is provided with trimming region apertures 314 and 316, which exhibits a phase that is inverse of a phase of each of the interconnect apertures 310 and 312. In the present embodiment, the longitudinal external side of the interconnect apertures 310 and 312 serves as an assist opaque region 322, and the assist opaque region 322 of the peripheral exposure region 320 is provided with a trimming region aperture 314 of phase π corresponding to the interconnect aperture 310 of phase 0°, and a trimming region aperture 316 of phase 0° corresponding to the interconnect aperture 312 of phase π.

In the method of forming the pattern of the present embodiment, an exposure process through the phase shifting mask 300 is conducted, and then, an additional exposure process is conducted through a trim mask (not shown) in place of the phase shifting mask, thereby removing a temporary pattern 216 in a basic pattern 214 formed by a process through the phase shifting mask 300. A condition of forming the pattern in the photoresist film 200 employing such method of forming the pattern will be described in reference to FIG. 13 to FIG. 15.

In the present embodiment, the exposure process through the phase shifting mask 300 provides transferring the image including portions corresponding to the apertures 310, 312, 314 and 316 and an exposed region of the peripheral thereof, corners of which are rounded, as shown in FIG. 13, and the rest of the portions corresponding to the apertures 310, 312, 314 and 316 and the exposed region of the peripheral thereof forms the basic pattern 214. The basic pattern 214 includes the interconnect pattern 212 and a temporary pattern 216 formed from the end portion of the interconnect pattern 212 to the longitudinal external side.

Here, along the width direction, the interconnect apertures 310 and 312 of different phases are arranged with a predetermined spacing therebetween, and along the longitudinal direction, trimming region apertures 314 and 316 of different phases are arranged with a predetermined spacing therebetween. More specifically, the longitudinal center of the interconnect pattern 212 exhibits similar optical condition as the optical condition in the longitudinal-end thereof, so that a generation of a constricted portion in the longitudinal direction-end of the interconnect pattern 212 be inhibited, thereby providing substantially straight width direction-peripheral of the interconnect pattern 212, as shown in FIG. 13.

Next, the phase shifting mask 300 is replaced with a trim mask, and an exposure process through the trim mask is conducted. A trimming pattern 218 for removing the pattern 216 to be removed is transferred by conducting such exposure process. More specifically, an outer side from the longitudinal end of the interconnect pattern 212 in the basic pattern 214 shown as a region of dotted lines in FIG. 14 is removed to form the interconnect pattern 212 shown in FIG. 15.

As such, according to the method of forming the pattern of the present embodiment, the pattern formed in the photoresist film 200 corresponding to the trimming region apertures 314 and 316 is eventually removed via a trimming by the exposure process through the trim mask. Thus, longitudinal-end of the interconnect apertures 310 and 312 exhibits similar optical condition as the longitudinal center thereof, so that a generation of a constricted portion be inhibited.

In the present embodiment, the peripheral exposure region 320 in the phase shifting mask 300 exhibits phase 0°, and resolution of the pattern may be easily influenced by an external leaked light around the apertures 310 and 316 of phase 0° in the phase shifting mask 300, which are adjacent to the peripheral exposure region 320. However, since the trimming region aperture 314 of phase π is arranged in a longitudinal external side of the interconnect aperture 310 of phase 0°, the interconnect aperture 310 is not influenced by the exposure region of the periphery thereof. Further, while the formed pattern is distorted by the influence of leaked light as shown in FIG. 13 since the trimming region aperture 316 of phase 0° is adjacent to the exposure region of the periphery thereof, the distorted pattern is eventually trimmed via the exposure process through the trim mask, and therefore there is no obstacle.

Figure 16:
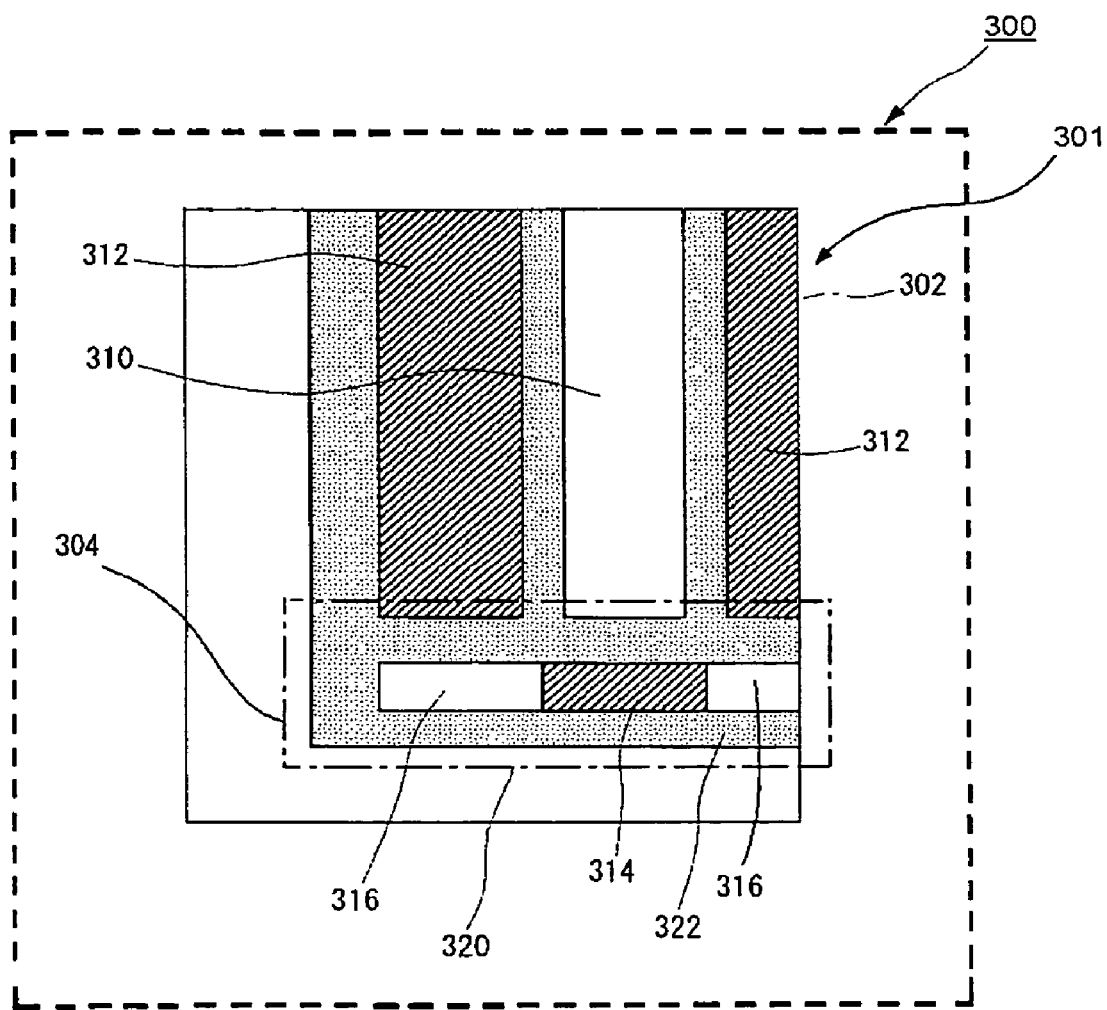
FIG. 16 is a partially enlarged view of a phase shifting mask, illustrating a configuration of a modified embodiment.

While the configuration of disposing the light shielding region interposed between the adjacent trimming region apertures 314 and 316 is illustrated in second embodiment, the adjacent trimming region apertures 314 and 316 may be continually disposed as shown in FIG. 16, for example, without disposing the light shielding region therebetween. In the configuration shown in FIG. 16, trimming region apertures 314 and 316, each of which exhibits a different phase, are formed to have larger widths than the corresponding interconnect apertures 310 and 312, respectively. As described above, maximum width-directional dimensions of the trimming region apertures 314 and 316 are ensured without providing a light shielding region, so that generations of distortions in the interconnect apertures 310 and 312 can be more effectively inhibited.

While the configuration of disposing the trimming region apertures 314 and 316 spaced apart from the interconnect apertures 310 and 312 interposing the light shielding region therebetween is illustrated in second embodiment, at least one of the interconnect apertures 310 and 312 may be alternatively arranged continually with the trimming region apertures 314 and 316, which are arranged in a longitudinal external side of the interconnect apertures 310 and 312, for example, as shown in FIG. 17 to FIG. 22.

Figure 17:
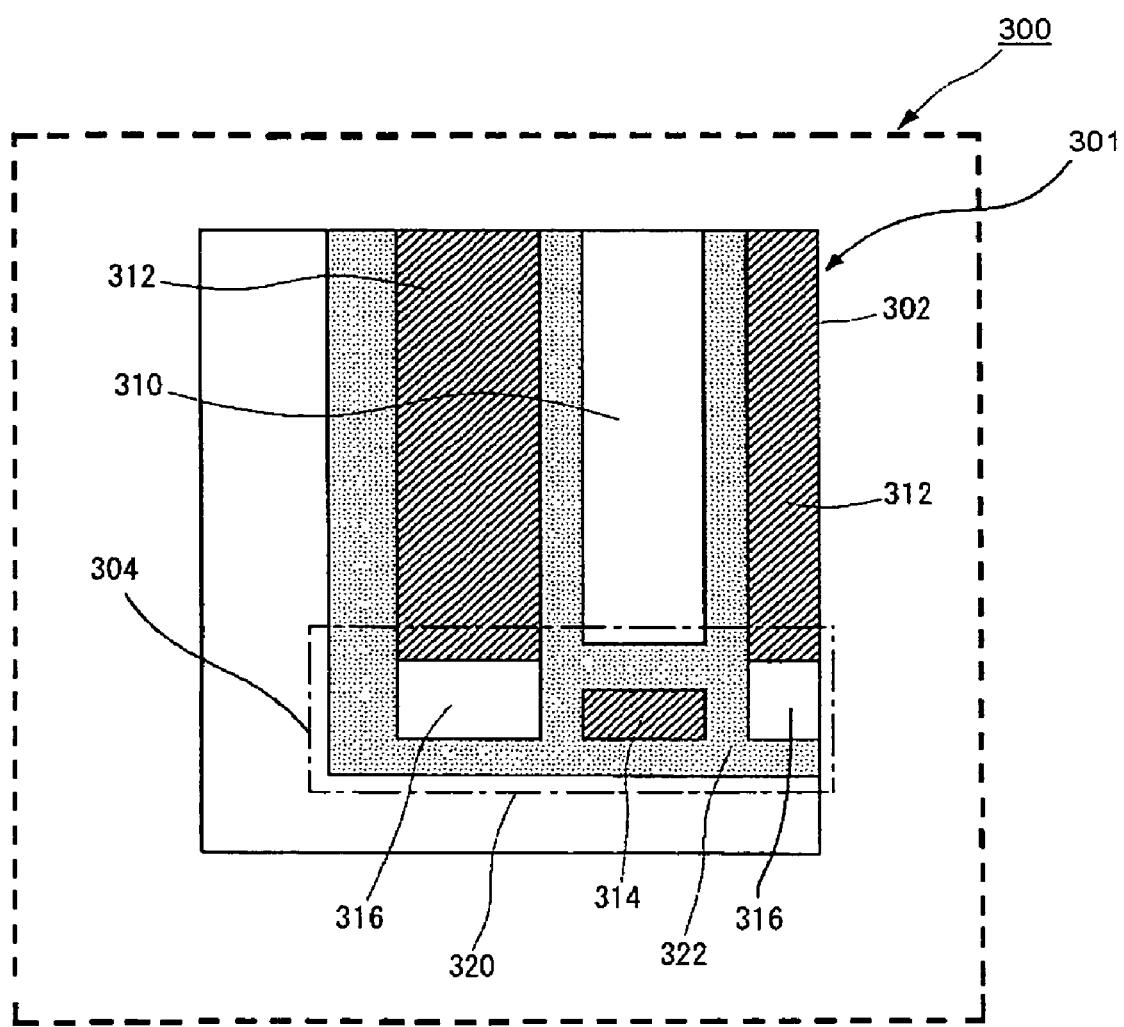
FIG. 17 is a partially enlarged view of a phase shifting mask, illustrating a configuration of a modified embodiment.

FIG. 17 illustrates a configuration that the interconnect aperture 312 of phase π is in contact with the trimming region aperture 316 of phase 0°. In FIG. 17, the interconnect aperture 312 of phase π is extended toward the longitudinal external side of the interconnect aperture 310 of phase 0° so that the interconnect aperture 312 is adjacent to the trimming region aperture 316 of phase 0°. This configuration provides an improved linearity of the interconnect pattern 212 formed in the photoresist film 200. Concerning the interconnect aperture 310 of phase 0°, a light shielding region is interposed with the trimming region aperture 314 of phase π. Such manner is advantageous when the interconnect aperture 312 of phase π is relatively narrow, since sufficient quantity of transmitted light can be ensured by extending the interconnect aperture 312 of phase π toward the longitudinal external side thereof.

Figure 18:
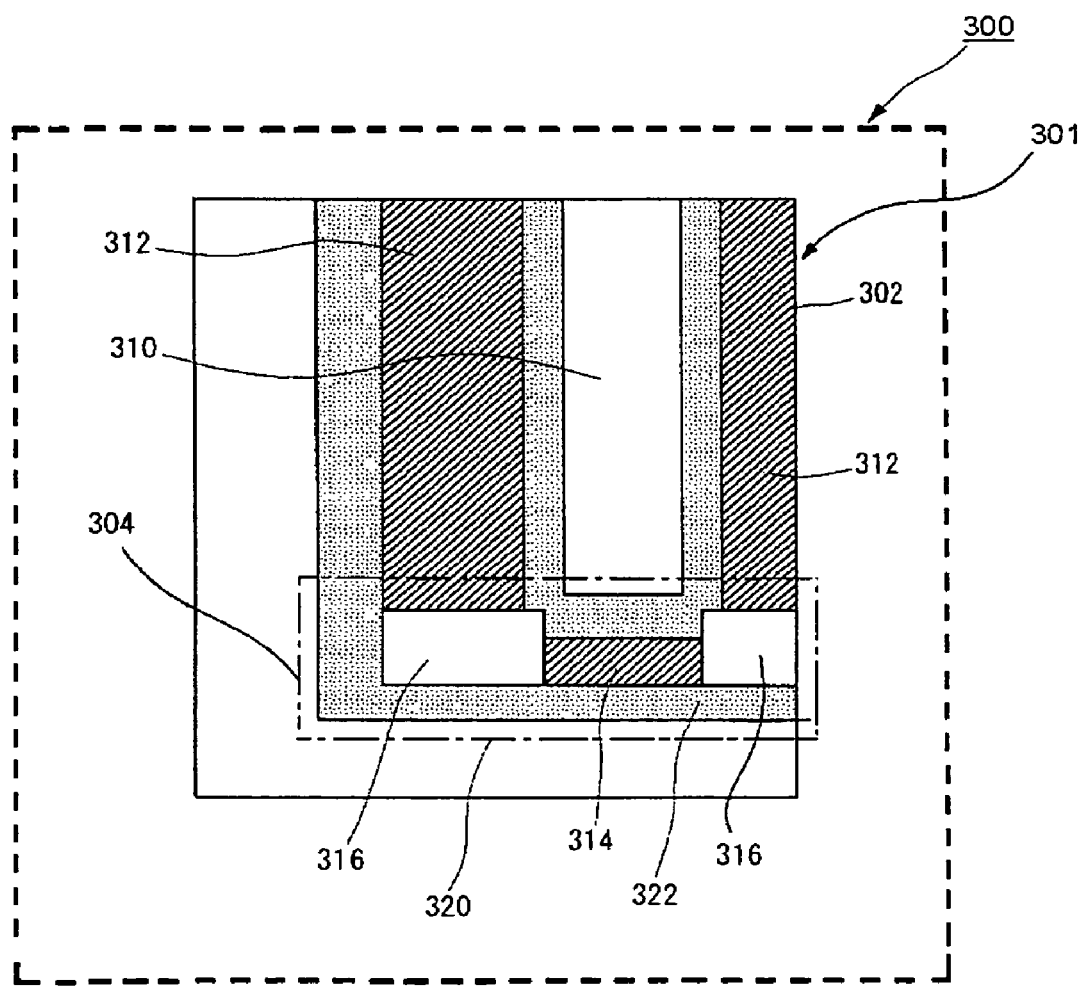
FIG. 18 is a partially enlarged view of a phase shifting mask, illustrating a configuration of a modified embodiment.

While the trimming region apertures 314 and 316 are formed to have widths, which are substantially the same as the widths of the interconnect apertures 310 and 312, respectively, and are disposed across the light shielding region interposed therebetween in the configuration shown in FIG. 17, the trimming region apertures 314 and 316 may be in contact with each other, as shown in FIG. 18. Having such configuration, generations of distortions in the interconnect apertures 310 and 312 can be more effectively inhibited.

Figure 19:
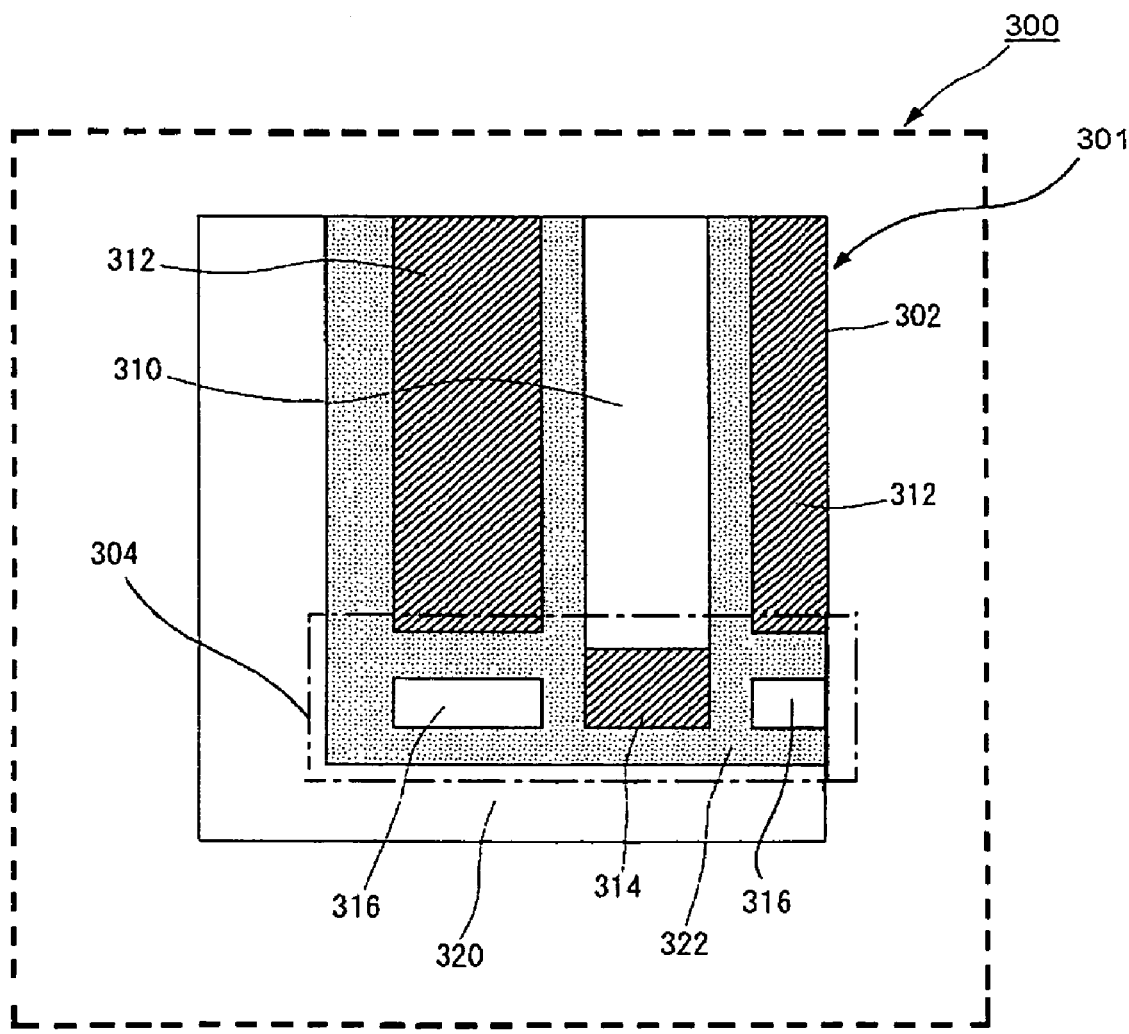
FIG. 19 is a partially enlarged view of a phase shifting mask, illustrating a configuration of a modified embodiment.

Further, as shown in FIG. 19, the interconnect aperture 310 of phase 0° may be configured to be in contact with the trimming region aperture 314 of phase π. In FIG. 19, the interconnect aperture 310 of phase 0° is extended toward the longitudinal external side of the interconnect aperture 312 of phase π so that the interconnect aperture 310 is adjacent to the trimming region aperture 314 of phase π. This configuration also provides an improved linearity of the interconnect pattern 212 formed in the photoresist film 200. Concerning the interconnect aperture 312 of phase π, a light shielding region is interposed with the trimming region aperture 316 of phase 0°. Such manner is advantageous when the interconnect aperture 310 of phase 0° is relatively narrow, since sufficient quantity of transmitted light can be ensured by extending the interconnect aperture 310 of phase 0° toward the longitudinal external side thereof.

Figure 20:
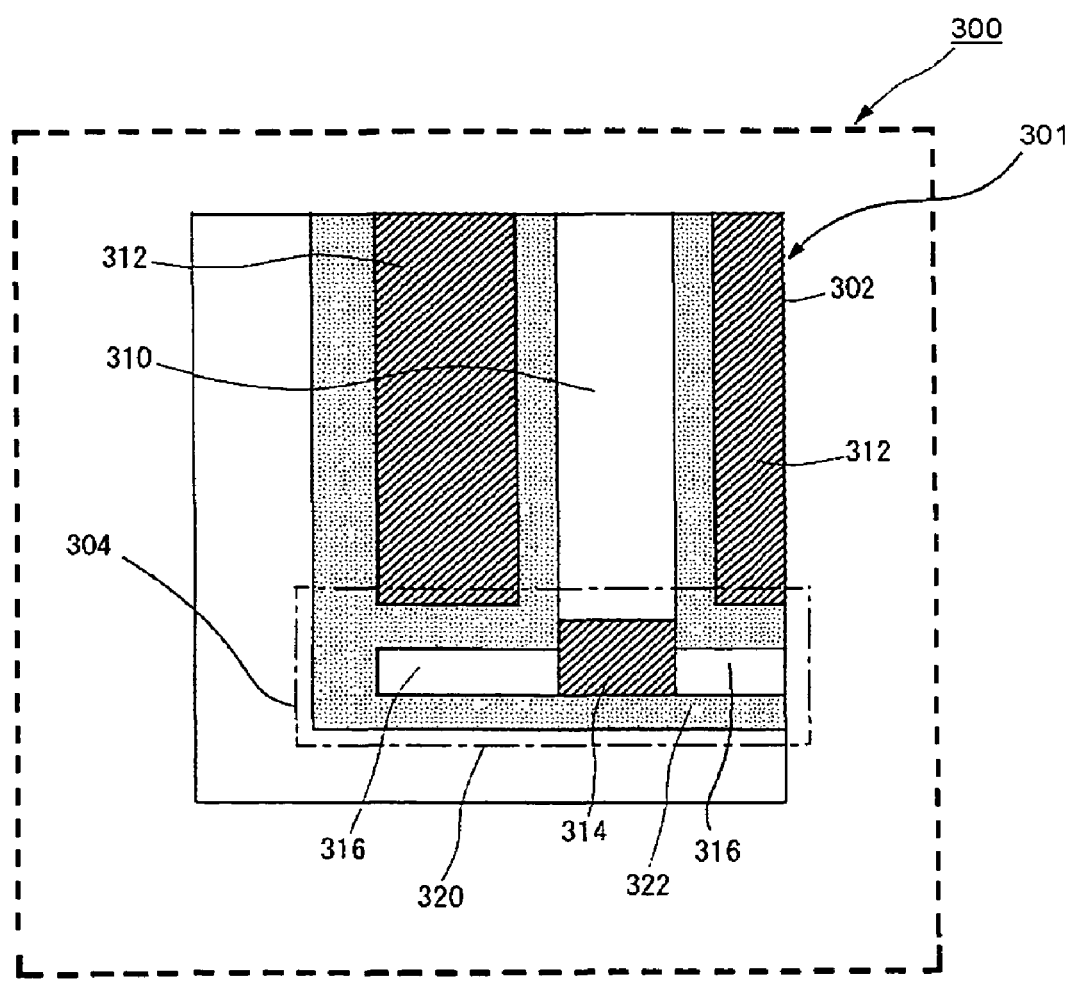
FIG. 20 is a partially enlarged view of a phase shifting mask, illustrating a configuration of a modified embodiment.

While the trimming region apertures 314 and 316 are formed to have widths, which are substantially the same as the widths of the interconnect apertures 310 and 312, respectively, and are disposed across the light shielding region interposed therebetween in the configuration shown in FIG. 19, the trimming region apertures 314 and 316 may be in contact with each other, as shown in FIG. 20. Having this configuration, generations of distortions in the interconnect apertures 310 and 312 can be more effectively inhibited.

Figure 21:
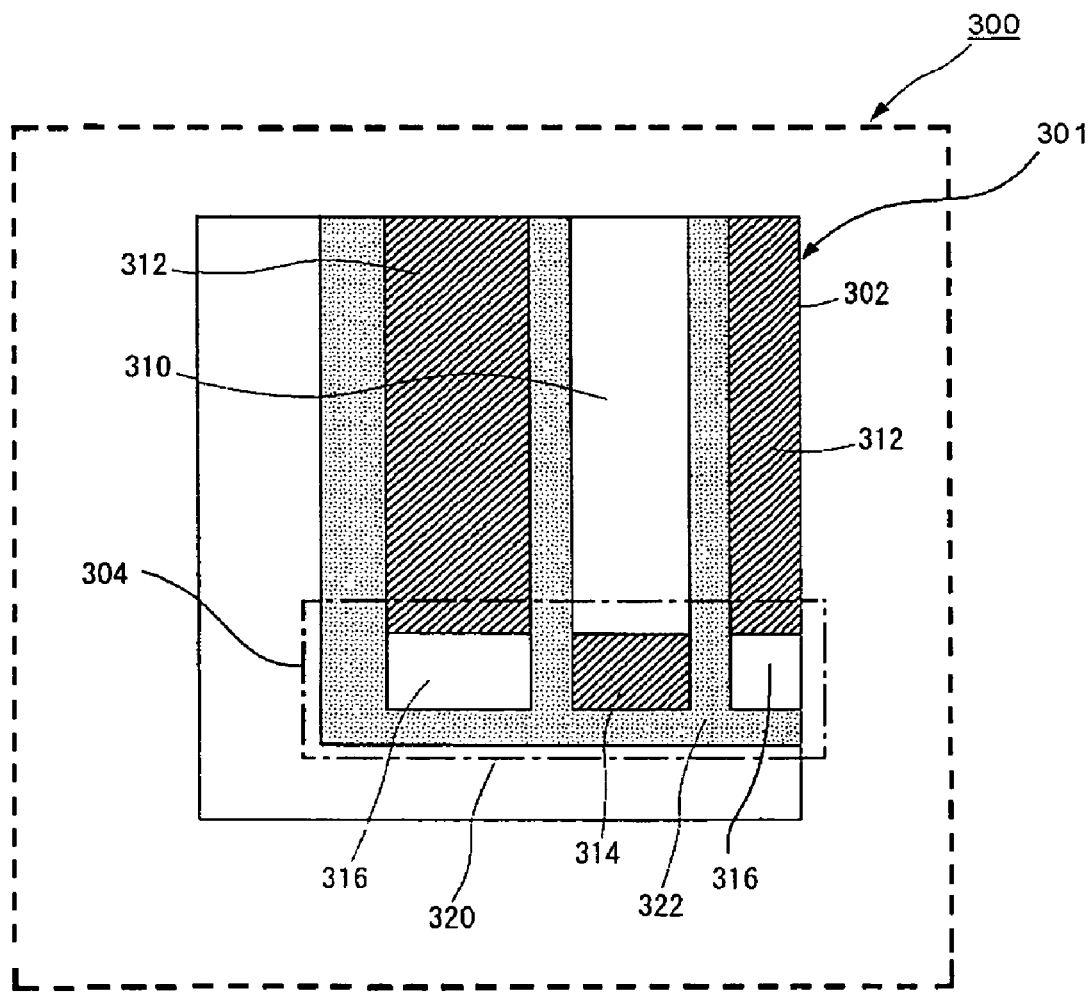
FIG. 21 is a partially enlarged view of a phase shifting mask, illustrating a configuration of a modified embodiment.
Figure 22:
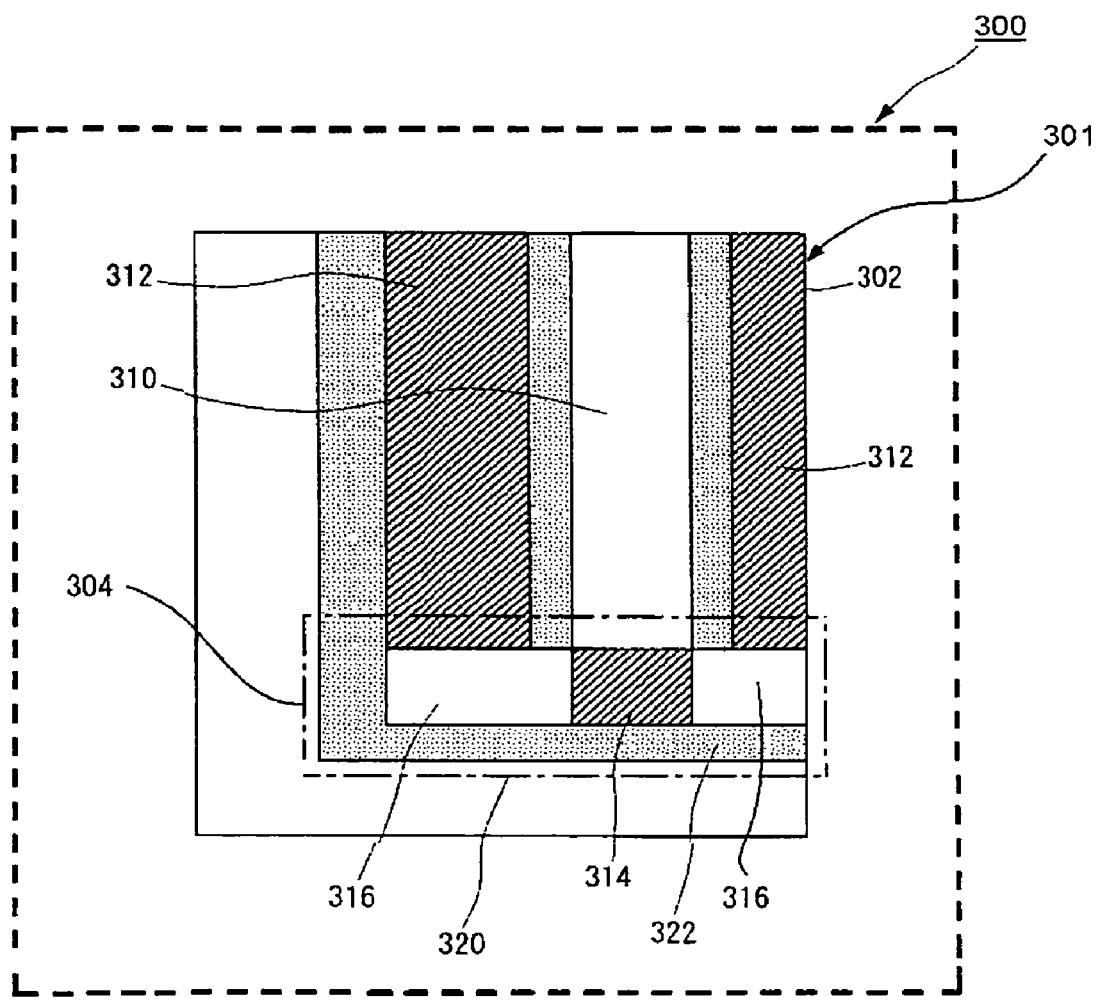
FIG. 22 is a partially enlarged view of a phase shifting mask, illustrating a configuration of a modified embodiment.

Further more, as shown in FIG. 21, both the interconnect aperture 310 of phase 0° and the interconnect aperture 312 of phase π may be configured to be in contact with the trimming region apertures 314 and 316, respectively. In FIG. 21, all the interconnect apertures 310 and 312 are extended toward the longitudinal external side thereof, so that these interconnect apertures are adjacent to the trimming region apertures 314 and 316. This configuration also provides an improved linearity of the interconnect pattern 212 formed in the photoresist film 200. While the trimming region apertures 314 and 316 are formed to have widths, which are substantially the same as the width of the interconnect apertures 310 and 312, respectively, and are disposed across the light shielding region interposed therebetween in the configuration shown in FIG. 21, the trimming region apertures 314 and 316 may be in contact with each other, as shown in FIG. 22. Having this configuration, generations of distortions in the interconnect apertures 310 and 312 can be more effectively inhibited.

Third Embodiment

Figure 23:
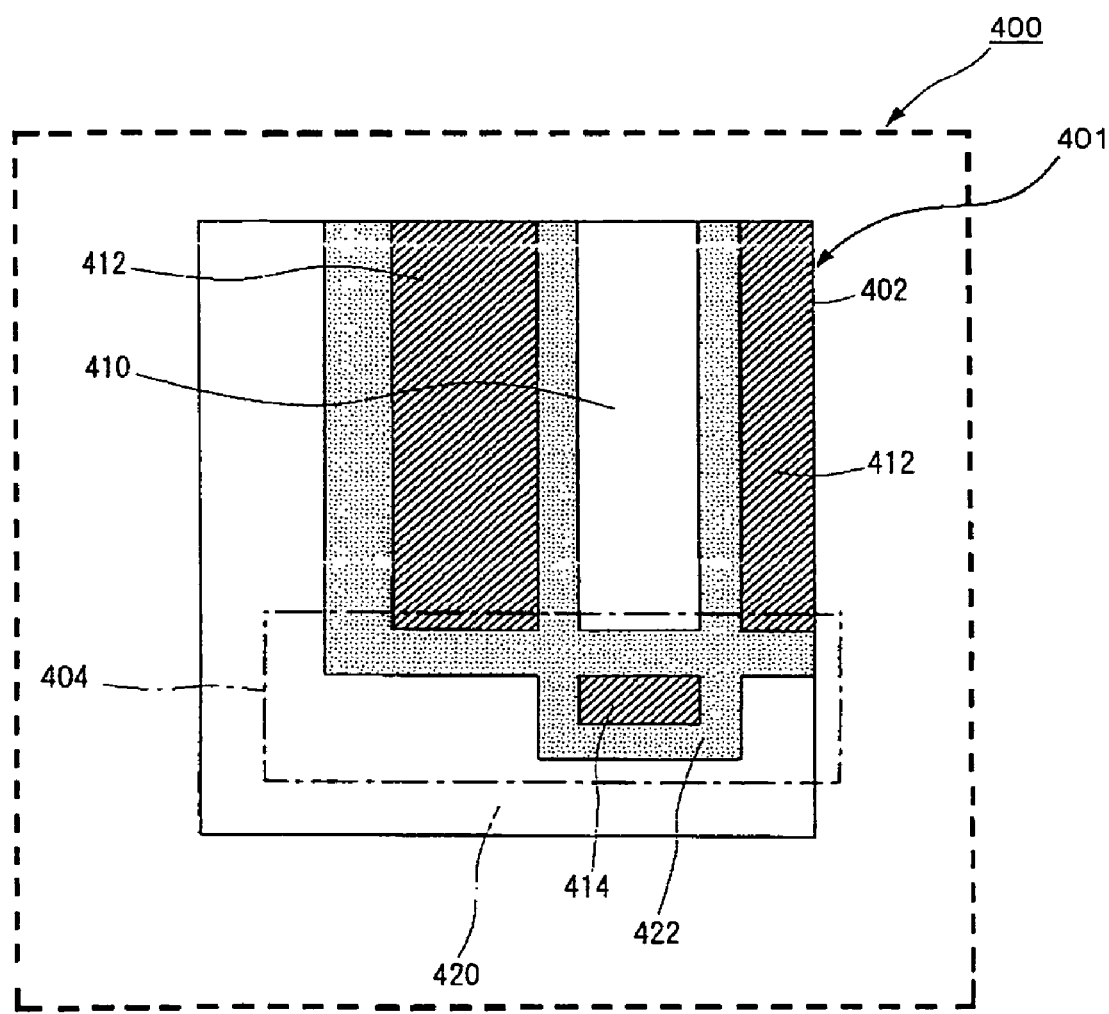
FIG. 23 is a partially enlarged view of a phase shifting mask, illustrating a configuration according to third embodiment.
Figure 24:
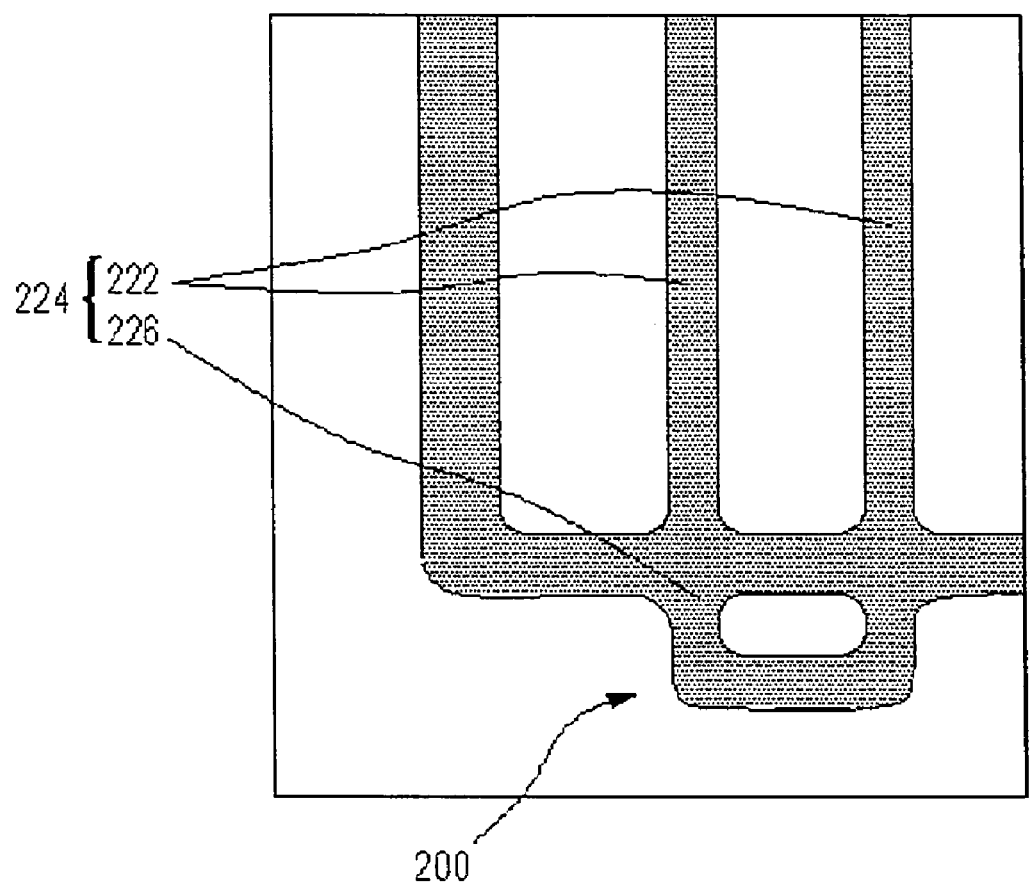
FIG. 24 is a partially enlarged view of a pattern formed in a photoresist film after an exposure by using the phase shifting mask.
Figure 25:
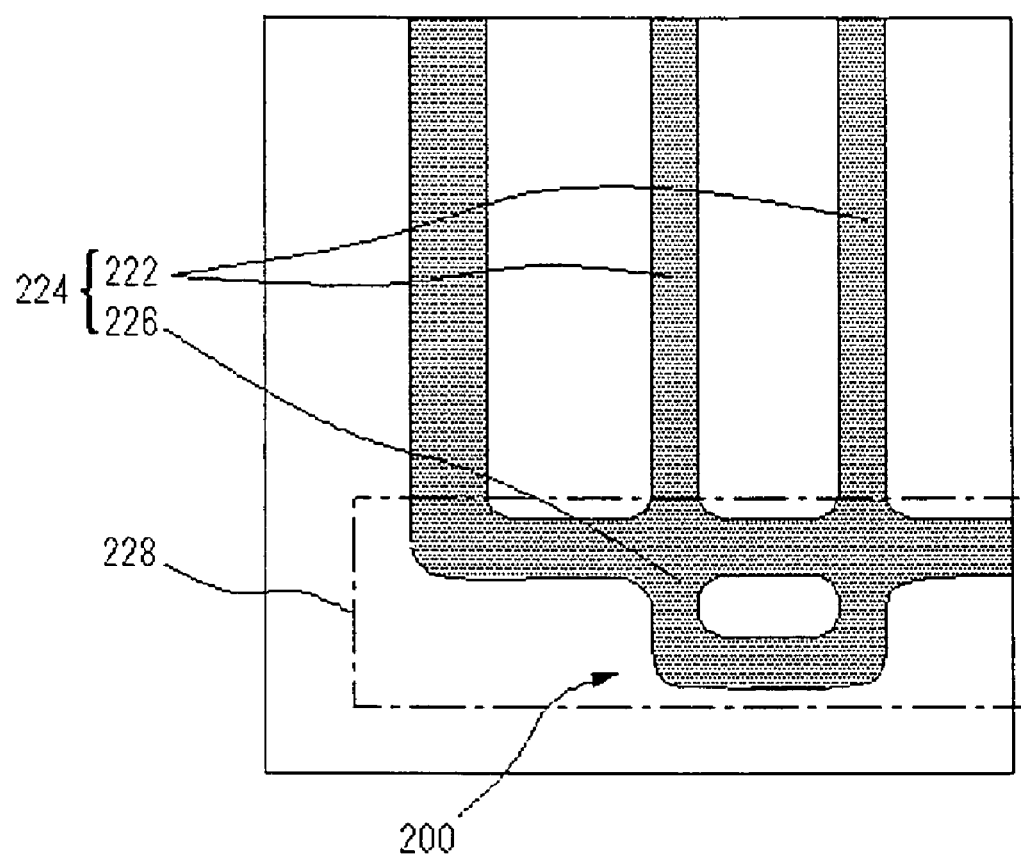
FIG. 25 is an partially enlarged view of a pattern formed in a photoresist film, illustrating a trimming region removed via a process employing a trim mask.
Figure 26:
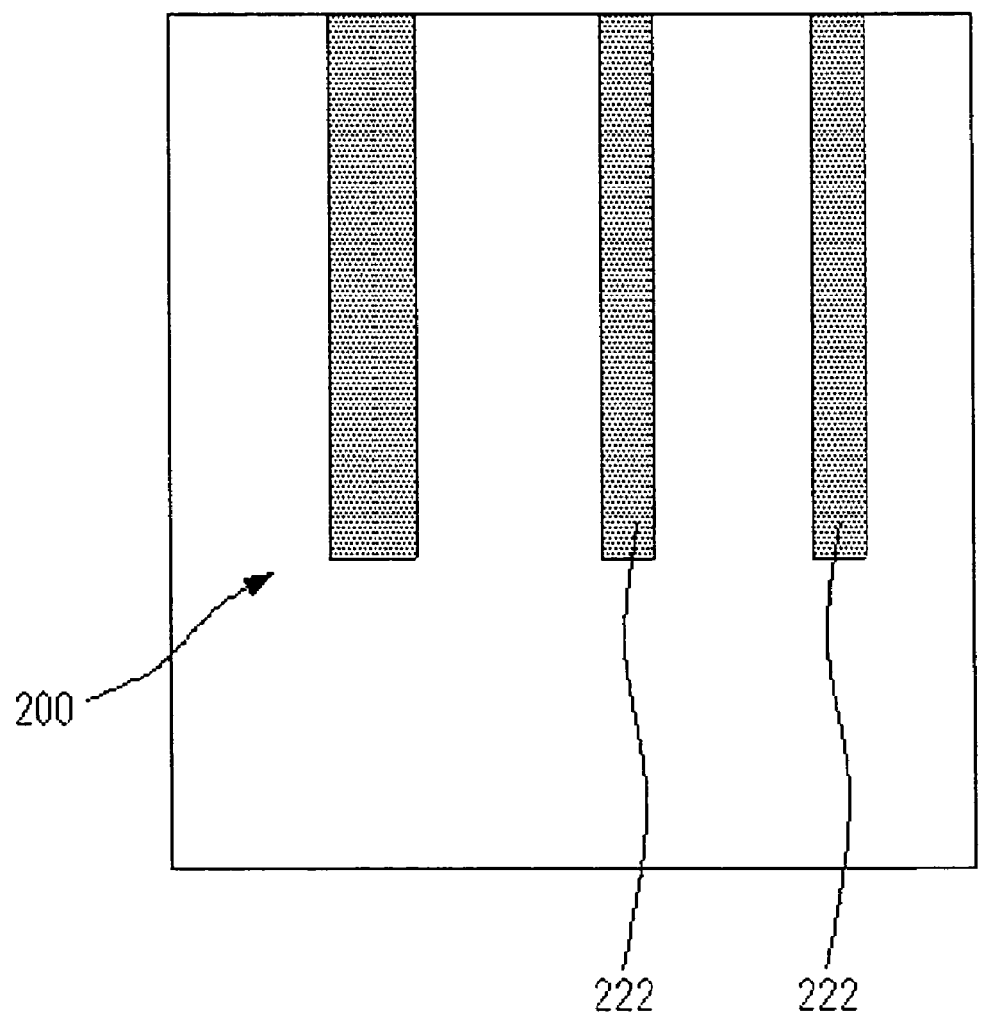
FIG. 26 is a partially enlarged view of a pattern formed in a photoresist film after an exposure by using the trim mask.

FIG. 23 to FIG. 26 illustrate third embodiment of the present invention, and specifically, FIG. 23 is a partially enlarged view of region containing a corner of a mask pattern of a phase shifting mask, FIG. 24 is a partially enlarged plan view of region containing a corner of a pattern, which is formed in a photoresist film after an exposure process through a phase shifting mask, FIG. 25 is a partially enlarged plan view of region containing a corner of a pattern, which is formed in the photoresist film, indicating a trimming region to be removed by a process through a trim mask, and FIG. 26 is a partially enlarged plan view of region containing a corner of a pattern, which is formed in the photoresist film after an exposure process through the trim mask.

A method of forming a pattern according to the present embodiment involves forming in a photoresist film 200 applied over a wafer an interconnect pattern 222 including a plurality of parallel straight lines, via an exposure process through a phase shifting mask 400 shown in FIG. 23. The phase shifting mask 400 is configured that a peripheral thereof is an exposure region, similarly as in the configuration of the phase shifting mask 200 of second embodiment. More specifically, the phase shifting mask 400 includes a peripheral exposure region 420, and the peripheral portion thereof is configured that no pattern is formed in the photoresist film 200 via the exposure process (see FIG. 24). In addition to above, the peripheral exposure region 420 exhibits phase 0°, which is one of the two different phases.

As shown in FIG. 23, in region 401 containing a corner of a mask pattern of the phase shifting mask 400, the inside region thereof includes a micro-pattern forming region 402 for forming an interconnect pattern 222. A trimming region 404 is configured to overlap the longitudinal end of the interconnect apertures 310 and 312, and is disposed in a longitudinal outer peripherals of the interconnect apertures 410 and 412.

Here, unlikely as the second embodiment, the longitudinal external side of the interconnect aperture 412 of phase π in the trimming region 404 is provided with no trimming region aperture of different phase, but provided with a peripheral exposure region 420, interposing a light shielding region having a predetermined dimension therebetween. Since the phase of the peripheral exposure region 420 is 0, the aperture serves as a different phase aperture over the interconnect aperture 412 around the longitudinal side of the interconnect aperture 412 of phase π.

Further, a trimming region aperture 414 of different phase π is provided in a longitudinal external side of the interconnect aperture 410 of phase 0°. In the present embodiment, the longitudinal external side of the interconnect aperture 410 of phase 0° serves as an assist opaque region 422, and the assist opaque region 422 is provided with a trimming region aperture 414 of phase π corresponding to the interconnect aperture 410 of phase 0°. More specifically, a longitudinal external side of the interconnect aperture 410 of phase 0° protrudes to enter into the peripheral exposure region 420.

In the method of forming the pattern of the present embodiment, an exposure process through the phase shifting mask 400 is conducted, and then, an additional exposure process is conducted through a trim mask (not shown) in place of the phase shifting mask, thereby removing a temporary pattern 226 in a basic pattern 224 formed by a process through the phase shifting mask 400. A condition of forming the pattern in the photoresist film 200 employing such method of forming the pattern will be described in reference to FIG. 24 to FIG. 26.

In the present embodiment, the exposure process through the phase shifting mask 400 provides transferring the image including portions corresponding to the apertures 410, 412 and 414 and an exposed region of the peripheral thereof, corners of which are rounded, as shown in FIG. 24, and the rest of the portions corresponding to the apertures 410, 412 and 414 and the exposed region of the peripheral thereof forms the basic pattern 224.

Here, along the width direction, the interconnect apertures 410 and 412 of different phases are arranged with a predetermined spacing therebetween, and along the longitudinal direction of the interconnect apertures 410, trimming region aperture 414 is arranged. More specifically, the longitudinal center of the interconnect pattern 222 exhibits similar optical condition as the optical condition in the longitudinal-end thereof, so that a generation of a constricted portion in the longitudinal direction-end of the interconnect pattern 222 be inhibited, thereby providing substantially uniform width direction-peripheral of the interconnect pattern 222, as shown in FIG. 24.

Next, the phase shifting mask 400 is replaced with a trim mask 122, and an exposure process through the trim mask 122 is conducted. A trimming pattern 228 for removing the pattern 226 to be removed is transferred by conducting such exposure process. More specifically, an outer side from the longitudinal end of the interconnect pattern 222 in the basic pattern 224 shown as a region of dotted lines in FIG. 25 is removed to form the interconnect pattern 222 shown in FIG. 26.

As such, according to the method of forming the pattern of the present embodiment, the pattern formed in the photoresist film 200 corresponding to the trimming region aperture 414 is eventually removed via a trimming by the exposure process through the trim mask. Thus, longitudinal-end of the interconnect apertures 410 and 412 exhibits similar optical condition as the longitudinal center thereof, so that a generation of a constricted portion would be inhibited.

In the present embodiment, the peripheral of the phase shifting mask 400 is an exposure region of phase 0°, and resolution of the pattern may be easily influenced by an external leaked light, if an aperture 410 of phase 0° in the phase shifting mask 400 approaches the exposure region. However, since the trimming region aperture 414 of phase π is arranged in a longitudinal external side of the interconnect aperture 410 of phase 0°, the interconnect aperture 410 is not influenced by the exposure region of the peripheral thereof.

Further, since the exposure region in the peripheral thereof serves as a different phase aperture against the interconnect aperture 412 of phase π, a light shielding region can be omitted, and thus a benefit of providing an increased design allowance by the size of the omitted region can be achieved.

Figure 27:
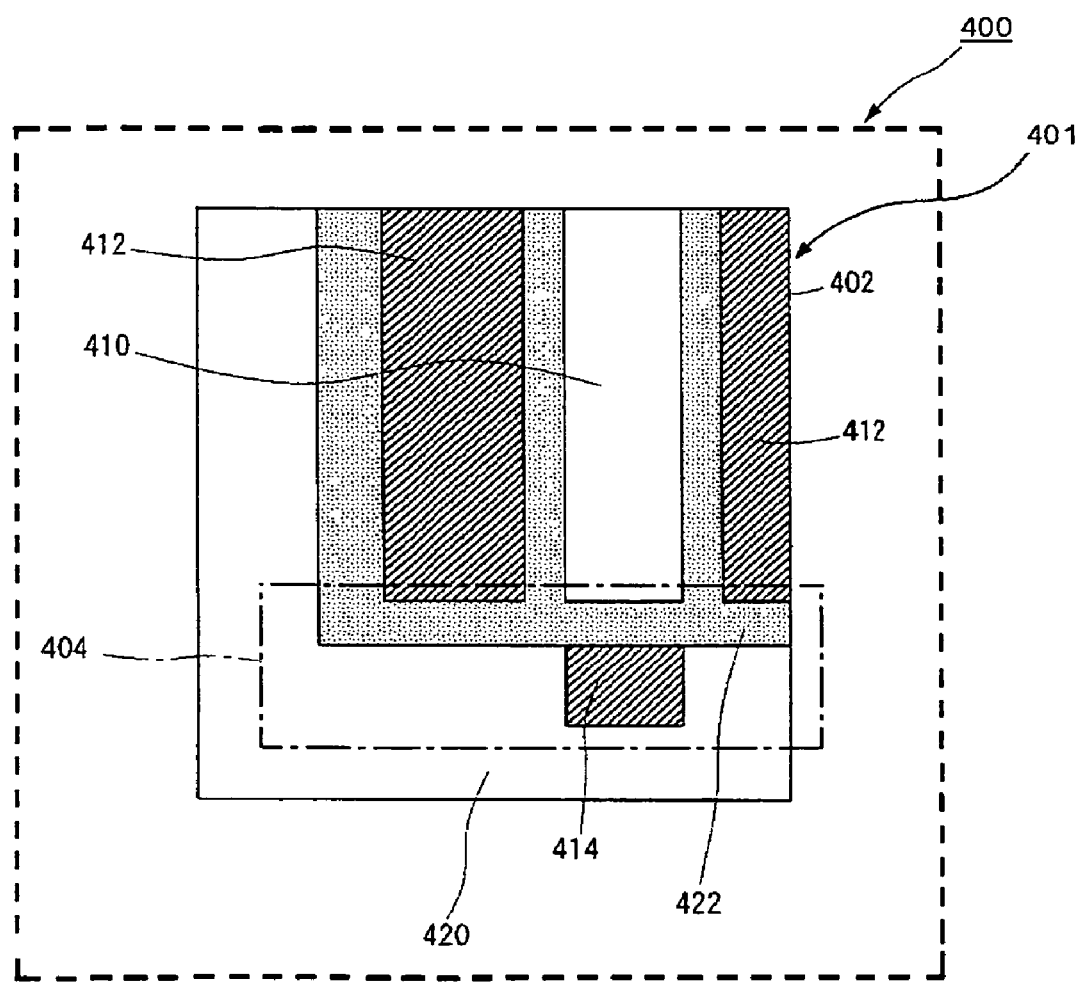
FIG. 27 is a partially enlarged view of a phase shifting mask, illustrating a configuration of a modified embodiment.

While the configuration of disposing the light shielding region interposed between the trimming region apertures 414 and the exposure region is illustrated in third embodiment, the trimming region apertures 414 and the exposure region may be continually disposed as shown in FIG. 27, for example, without disposing the light shielding region therebetween.

While the configuration of disposing the trimming region aperture 414 of phase π spaced apart from the interconnect aperture 410 of phase 0° interposing the light shielding region therebetween and disposing the interconnect aperture 412 of phase π spaced apart from the exposure region interposing the light shielding region therebetween is illustrated in third embodiment, the trimming region aperture 414 and interconnect aperture 410 may be alternatively arranged to contact with at least one of the exposure region and the interconnect aperture 412 for example, as shown in FIG. 28 to FIG. 32.

Figure 28:
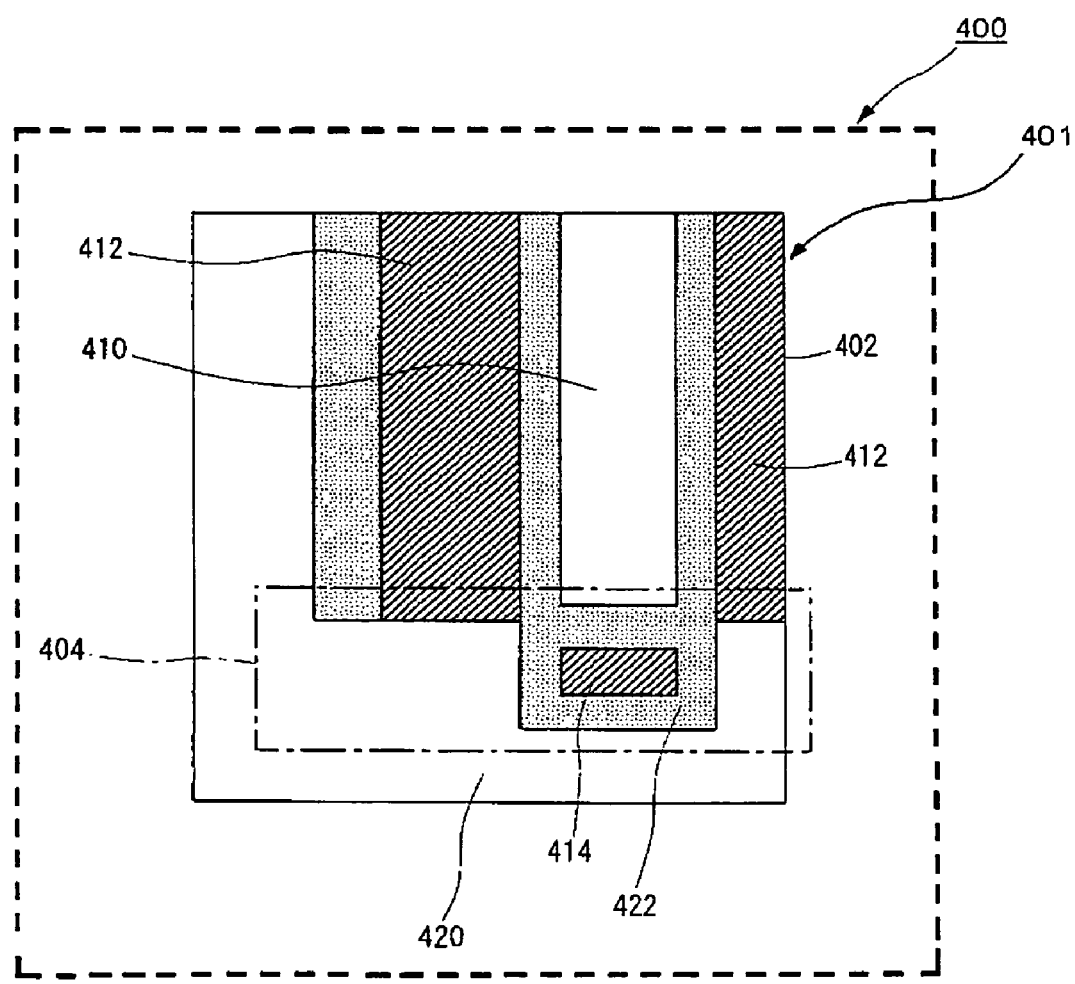
FIG. 28 is a partially enlarged view of a phase shifting mask, illustrating a configuration of a modified embodiment.

FIG. 28 illustrates a configuration that the interconnect aperture 412 of phase π is in contact with the exposure region.

In FIG. 28, the interconnect aperture 412 of phase π is extended toward the longitudinal external side of the interconnect aperture 410 of phase 0° so that the interconnect aperture 412 is adjacent to the exposure region. This configuration provides an improved linearity of the interconnect pattern 222 formed in the photoresist film 200. Concerning the interconnect aperture 410 of phase 0°, a light shielding region is interposed with the trimming region aperture 414 of phase π. Such manner is advantageous when the interconnect aperture 412 of phase π is relatively narrow, since sufficient quantity of transmitted light can be ensured by extending the interconnect aperture 412 of phase π toward the longitudinal external side thereof.

Figure 29:
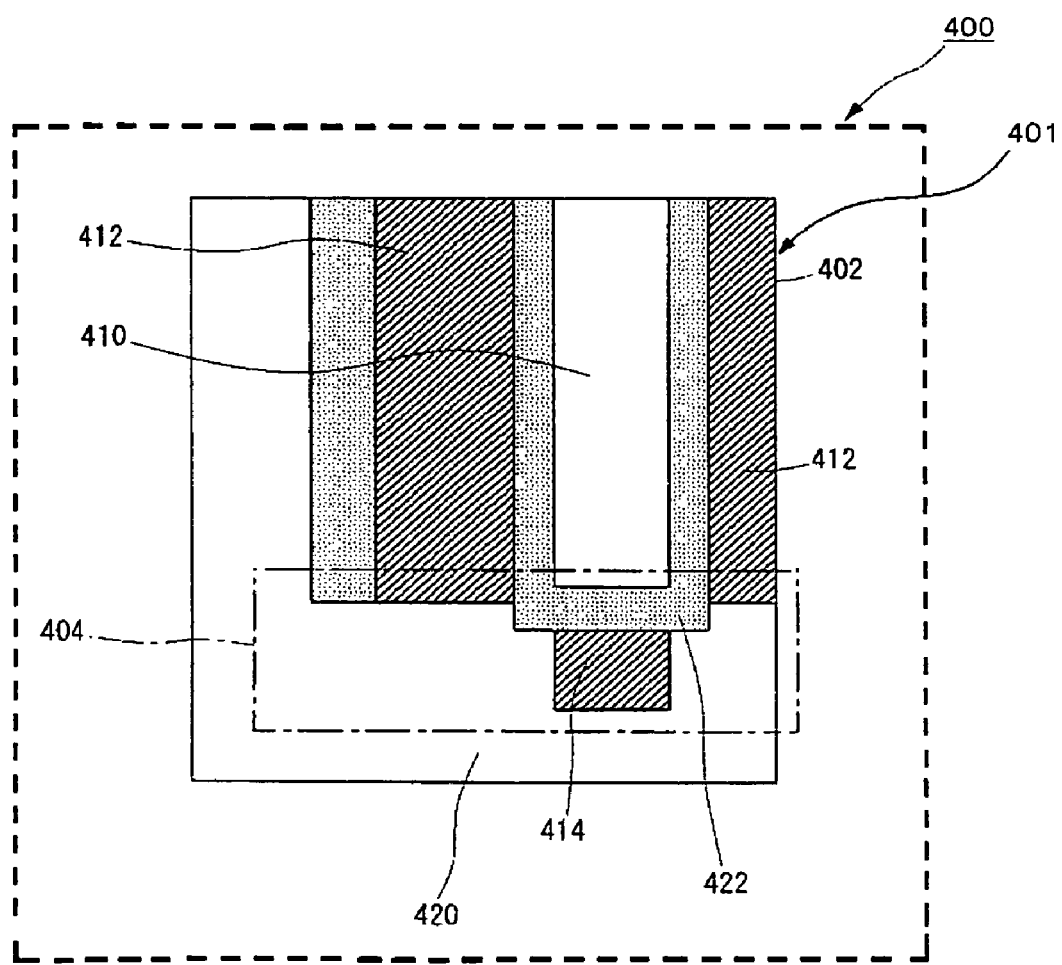
FIG. 29 is a partially enlarged view of a phase shifting mask, illustrating a configuration of a modified embodiment.

While the trimming region aperture 414 of phase π is formed to have a width that is substantially the same as the width of the interconnect aperture 410 of phase 0°, and is disposed interposing the light shielding region with the exposure region in the configuration shown in FIG. 28, the trimming region aperture 414 may be in contact with the exposure region, as shown in FIG. 29. Having this configuration, a generation of a distortion in the interconnect aperture 412 of phase π can be more effectively inhibited.

Figure 30:
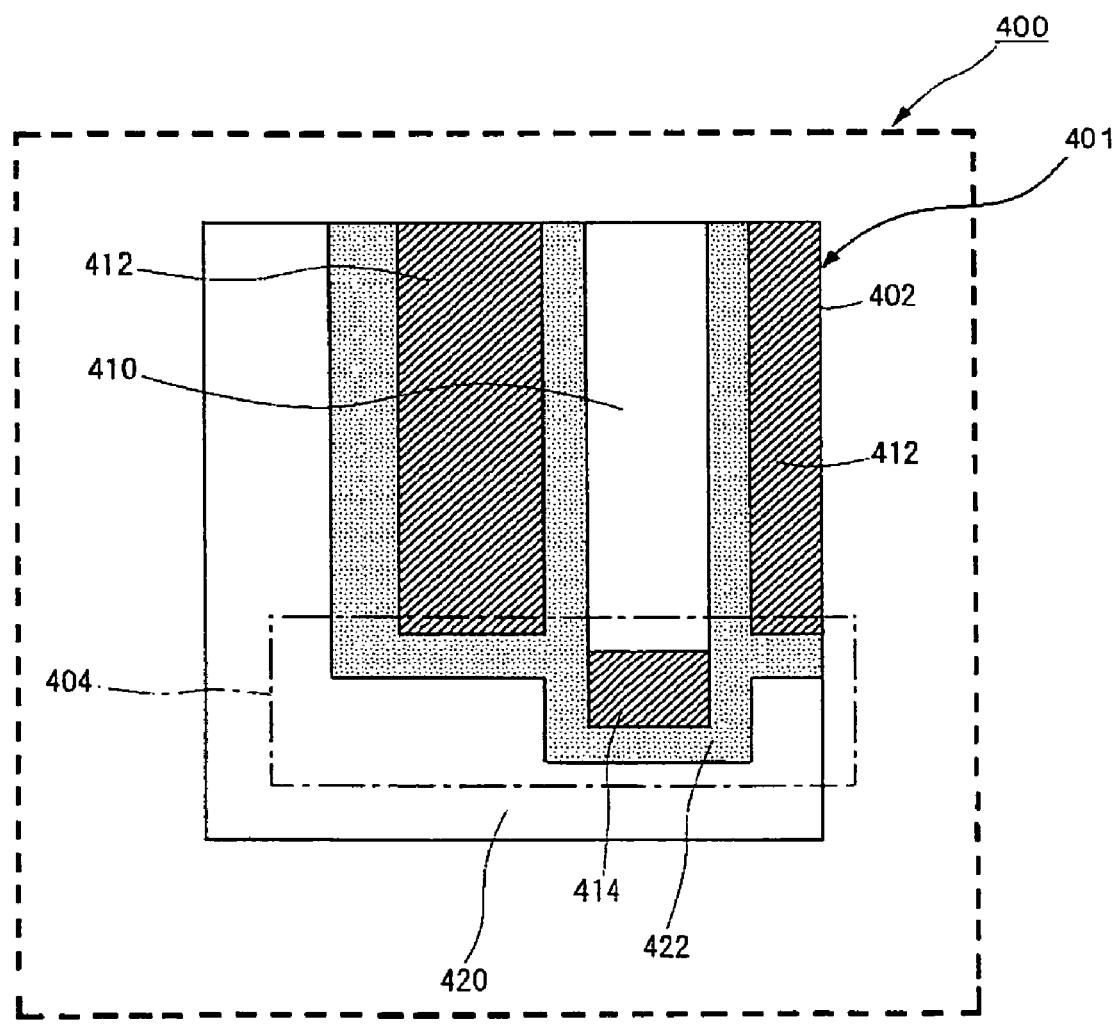
FIG. 30 is a partially enlarged view of a phase shifting mask, illustrating a configuration of a modified embodiment.

Further more, as shown in FIG. 30, the interconnect aperture 410 of phase 0° may be in contact with the trimming region aperture 414 of phase π. In FIG. 30, the interconnect aperture 410 of phase 0° is extended toward the longitudinal external side of the interconnect aperture 412 of phase π so that the interconnect aperture 410 is adjacent to the trimming region aperture 414 of phase π. This configuration also provides an improved linearity of the interconnect pattern 222 formed in the photoresist film 200. Concerning the interconnect aperture 412 of phase π, a light shielding region is interposed with the exposure region. Such manner is advantageous when the interconnect aperture 410 of phase 0° is relatively narrow, since sufficient quantity of transmitted light can be ensured by extending the interconnect aperture 410 of phase 0° toward the longitudinal external side thereof.

Figure 31:
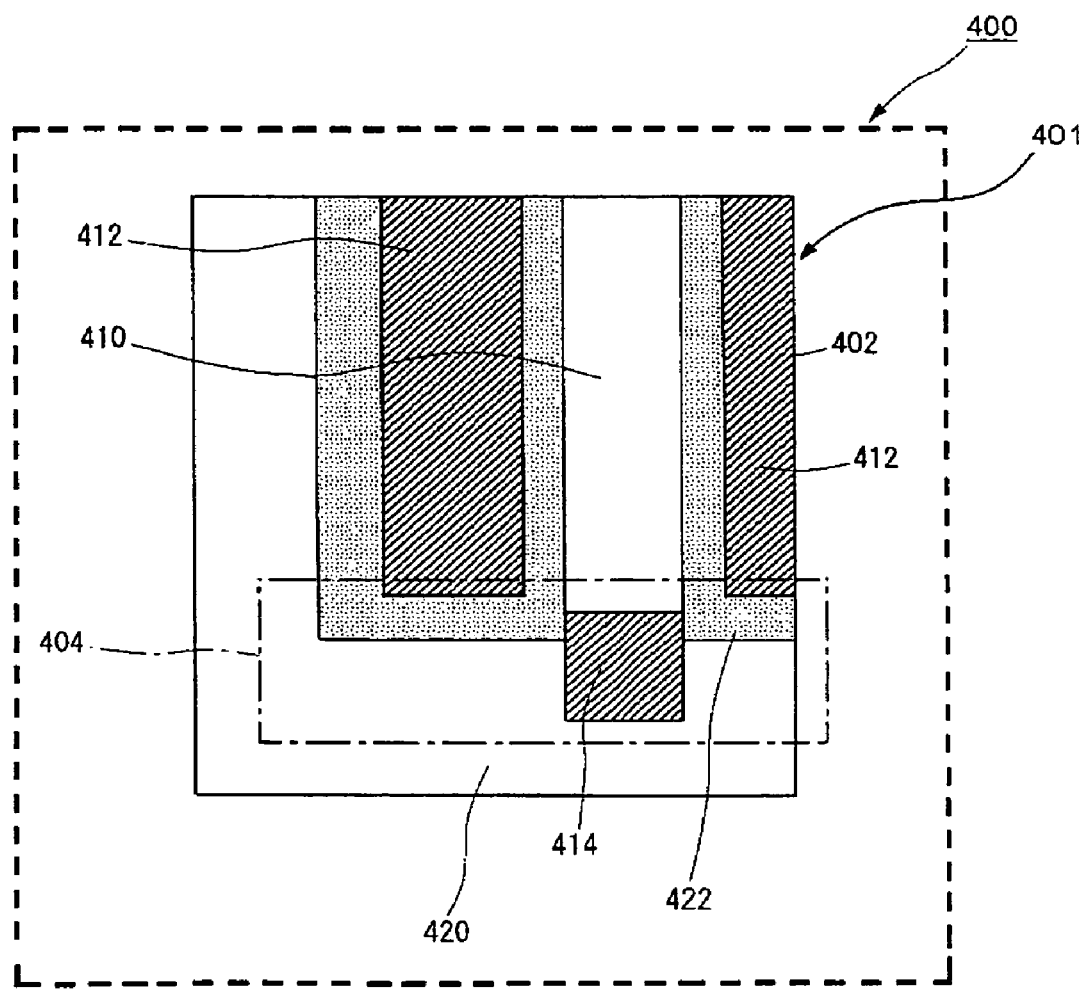
FIG. 31 is a partially enlarged view of a phase shifting mask, illustrating a configuration of a modified embodiment.

While the trimming region aperture 414 of phase π is formed to have a width that is substantially the same as the width of the interconnect aperture 410 of phase 0°, and is disposed interposing the light shielding region between the trimming region aperture 414 and the exposure region in the configuration shown in FIG. 30, the trimming region aperture 414 may be in contact with the exposure region, as shown in FIG. 31. Having this configuration, generations of distortions in the interconnect apertures 410 and 412 can be more effectively inhibited.

Figure 32:
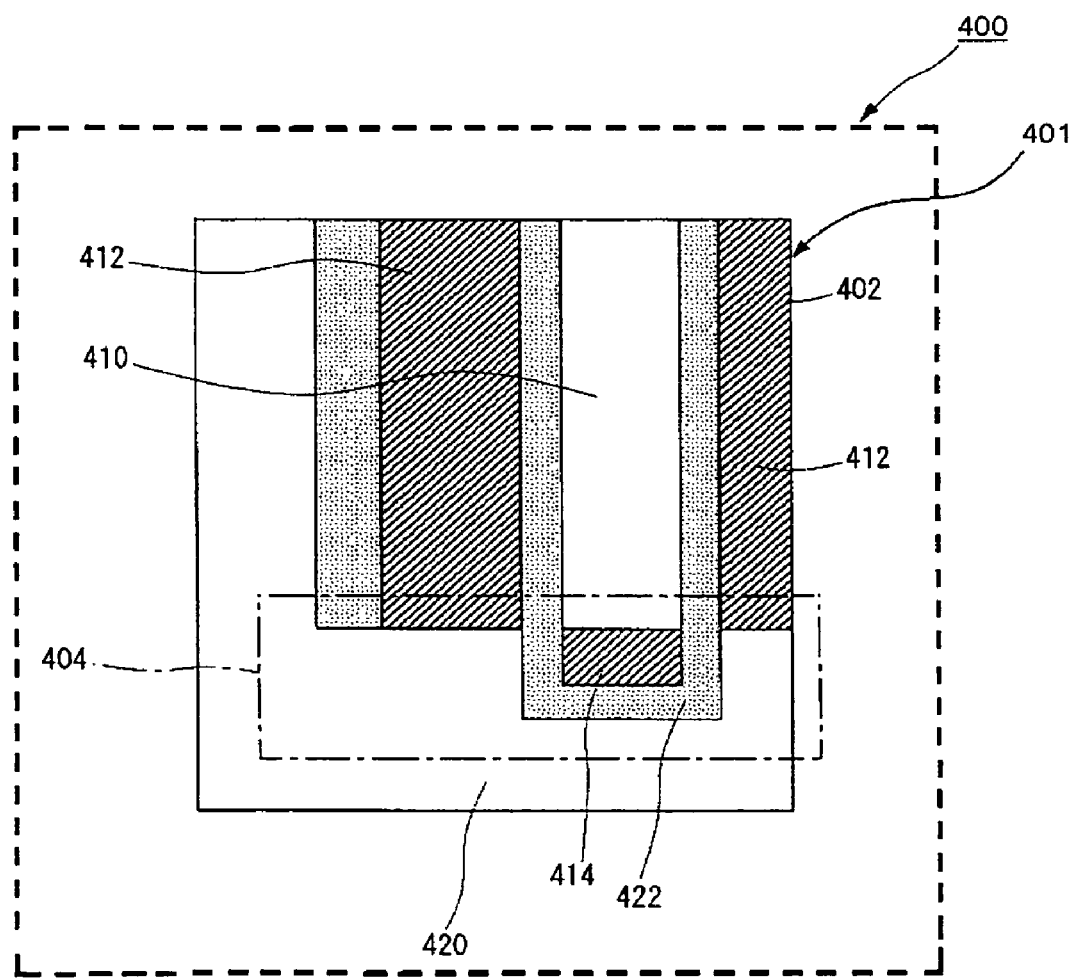
FIG. 32 is a partially enlarged view of a phase shifting mask, illustrating a configuration of a modified embodiment.
Figure 33:
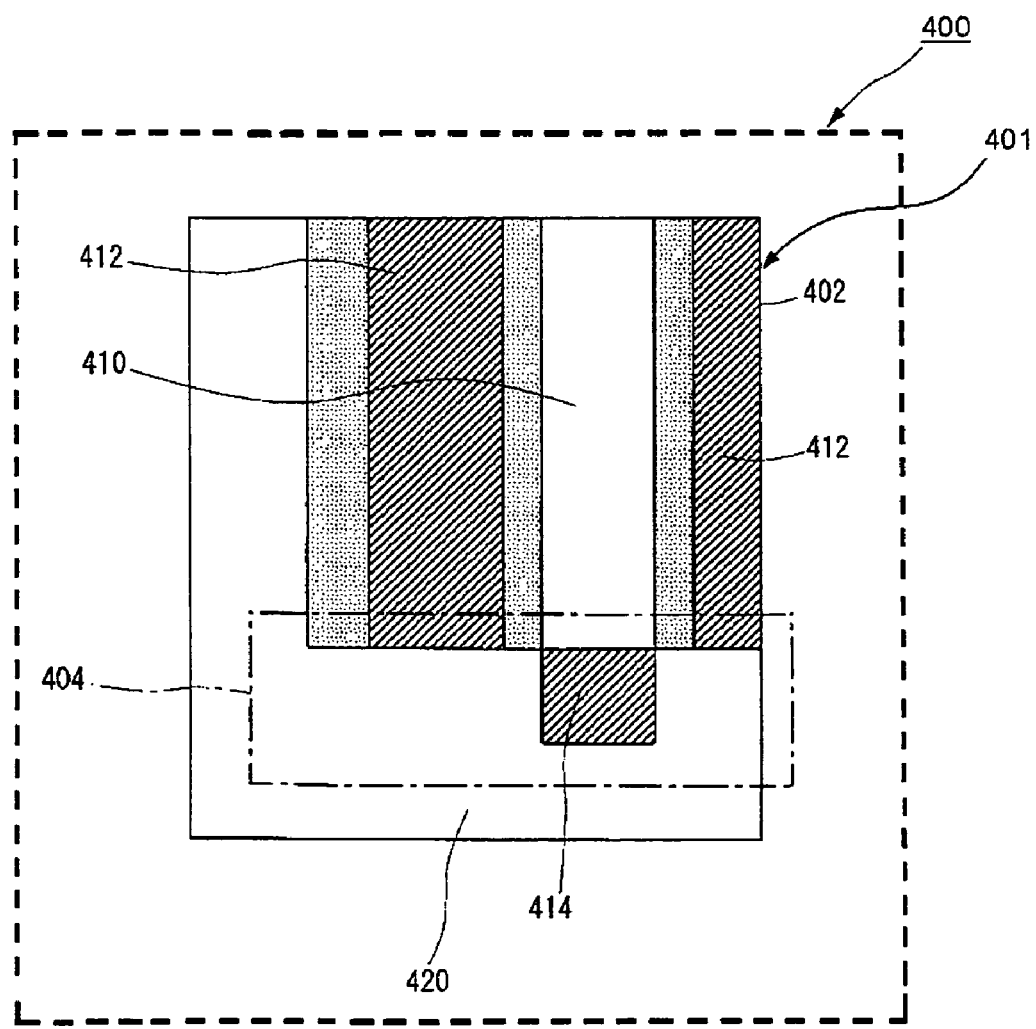
FIG. 33 is a partially enlarged view of a phase shifting mask, illustrating a configuration of a modified embodiment.

Further more, as shown in FIG. 32, the interconnect aperture 410 of phase 0° may be in contact with the trimming region aperture 414 and the interconnect aperture 412 of phase π may be in contact with the exposure region. In FIG. 32, all the interconnect apertures 410 and 412 are extended toward the longitudinal external side thereof so that the interconnect aperture 410 is adjacent to the trimming region aperture 414 or the exposure region. This configuration also provides an improved linearity of the interconnect pattern 222 formed in the photoresist film 200. While the trimming region aperture 414 is formed to have a width that is substantially the same as the width of the interconnect aperture 410, and is disposed interposing the light shielding region with the exposure region in the configuration shown in FIG. 32, the trimming region aperture 414 may be disposed to be adjacent to the exposure region, as shown in FIG. 33.

Having this configuration, generations of distortions in the interconnect apertures 410 and 412 can be more effectively inhibited.

While the exemplary implementations of so-called dual exposure for simultaneously removing the basic pattern 204, 214 or 224 via the exposure process through the trim mask have been illustrated in first to third embodiments, the interconnect pattern may be obtained by an alternative process, in which, for example, an exposure process through the phase shifting mask 100, 300 or 400 is conducted and only a hard mask layer is etched, and then, an exposure process through a trim mask and a hard mask layer and a target layer are removed. More specifically, the alternative process may be configured that a sacrificial film includes: a hard mask formed on or over a wafer; a first photoresist film employed for etching the hard mask; and a second photoresist film applied on the wafer after the hard mask is etched through the first photoresist film, and the basic pattern is transferred onto the first photoresist film via an exposure process through the phase shifting mask, and the trimming pattern is transferred onto the second photoresist film via an exposure process through the trim mask, after the hard mask is etched through a mask of the first photoresist film, on which the basic pattern is transferred.

Further, it should be noted that wave length of light employed in the exposure process, numerical aperture (NA) of optical lens, NA ratio (σ) of lighting system and imaging system, widths of the interconnect apertures 110, 112, 310, 312, 410 and 412, and lengths of the interconnect apertures 110, 112, 310, 312, 410 and 412 can be suitably modified, and specific detailed structure or the like can be suitably modified.

It is apparent that the present invention is not limited to the above embodiment, and may be modified and changed without departing from the scope and spirit of the invention.

This invention is a method of forming a pattern including a fine line pattern in a sacrificial film such as a photorest film or a hard mask film. The pattern in the sacrificial film is transferred to an underlying film after dry etching process. The underlying film is metal, silicon, or dielectric materials, for example. Here, the pattern including a fine line pattern could be various interconnections in semiconductor device including gate electrode.

What is claimed is:

1. A method of forming a pattern, in which an interconnect pattern including a plurality of straight lines that are arranged in parallel is formed in a photoresist film on or over a wafer by exposing thereof to light through a phase shifting mask, said phase shifting mask having interconnect apertures that extend toward a predetermined direction and are arranged in parallel, and said phase shifting mask also being configured that transmitted lights of two different phases are alternately assigned in the interconnect apertures, said method comprising:

providing a different phase aperture in a longitudinal external side of each corresponding one of said interconnect apertures in said phase shifting mask, said different phase aperture providing a phase of transmitted light that is different from a phase of light through the corresponding one of said interconnect apertures;

transferring a basic pattern in a photoresist film via an exposure by using said phase shifting mask, said basic pattern containing said interconnect pattern and a temporary pattern formed from an end of said interconnect pattern toward a longitudinal external side thereof; and transferring a temporary pattern in a photoresist film for removing said temporary pattern from said basic pattern via an exposure by using a trim mask.

2. The method of forming a pattern according to claim 1, wherein said phase shifting mask includes a peripheral opaque region in a longitudinal external side of each of said interconnect apertures, and said different phase aperture is formed in said peripheral opaque region.

3. The method of forming a pattern according to claim 1, wherein said phase shifting mask includes a peripheral exposure region in a longitudinal external side of each of said interconnect apertures, and said different phase aperture is disposed in said peripheral exposure region.

4. The method of forming a pattern according to claim 3, wherein a light of one phase in two inverse-phase lights is assigned in said peripheral exposure region, and wherein said peripheral exposure region forms said different phase aperture of the corresponding interconnect aperture around the longitudinal direction of said interconnect apertures, for which light of the other phase is assigned.

5. The method of forming a pattern according to claim 1, wherein said phase shifting mask is configured that said different phase apertures, which are disposed in a mutually adjacent relationship, are continually arranged.

6. The method of forming a pattern according to claim 1, wherein said phase shifting mask is arranged continually with said different phase apertures, which is configured that at least one of said interconnect apertures is arranged in a longitudinal external side of an aperture for interconnect.

7. A method of forming a pattern, in which an interconnect pattern including a plurality of straight lines that are arranged in parallel is formed in a sacrificial film on or over a wafer by exposing thereof to light through a phase shifting mask, said phase shifting mask having interconnect apertures that extend toward a predetermined direction and are arranged in parallel, and said phase shifting mask also being configured that transmitted lights of two different phases are alternately assigned in the interconnect apertures, wherein said sacrificial film includes: a hard mask formed on said wafer; a first photoresist film employed for etching said hard mask; and a second photoresist film applied on said wafer after said hard mask is etched through said first photoresist film, wherein said method comprising:

providing a different phase aperture in a longitudinal external side of each corresponding one of said interconnect apertures in said phase shifting mask, said different phase aperture providing a phase of transmitted light that is different from a phase of light through the corresponding one of said interconnect apertures;

etching said hard mask by using a mask of said first photoresist film, on which said basic pattern is transferred; and transferring a temporary pattern in said second photoresist film for removing said temporary pattern from said basic pattern via an exposure by using a trim mask.

8. The method of forming a pattern according to claim 7, wherein said phase shifting mask includes a peripheral opaque region in a longitudinal external side of each of said interconnect apertures, and said different phase aperture is formed in said peripheral opaque region.

9. The method of forming a pattern according to claim 7, wherein said phase shifting mask includes a peripheral exposure region in a longitudinal external side of each of said interconnect apertures, and said different phase aperture is disposed in said peripheral exposure region.

10. The method of forming a pattern according to claim 7, wherein a light of one phase in two inverse-phase lights is assigned in said peripheral exposure region, and wherein said peripheral exposure region forms said different phase aperture of the interconnect aperture around the longitudinal direction of each of said interconnect apertures, for which light of the other phase is assigned.

11. The method of forming a pattern according to claim 7, wherein said phase shifting mask is configured that said different phase apertures, which are disposed in a mutually adjacent relationship, are continually arranged.

12. The method of forming a pattern according to claim 7, wherein said phase shifting mask is arranged continually with said different phase apertures, which is configured that at least one of said interconnect apertures is arranged in a longitudinal external side of an aperture for interconnect.

13. A method of forming a pattern, in which an interconnect pattern including a plurality of straight lines that are arranged in parallel is formed in a photo-resist film on or over a wafer by exposing thereof to light through a phase shifting mask, said phase shifting mask having interconnect apertures that extend toward a predetermined direction and are arranged in parallel, and said phase shifting mask also being configured that transmitted lights of two different phase are alternately assigned in the interconnect aperture, said method comprising:

forming a different phase aperture in a longitudinal external side of said interconnect aperture corresponding to said interconnect pattern, in said phase shifting mask, said different phase aperture providing a phase of transmitted light that is different from a phase of light through said interconnect aperture;

transferring a basic pattern in a photoresist film via an exposure by using said phase shifting mask, said basic pattern containing said interconnect pattern and a temporary pattern formed from an end of said interconnect pattern toward a longitudinal external side thereof; and transferring a temporary pattern in a photoresist film for removing said temporary pattern from said basic pattern via an exposure by using a trim mask.

* * * * *